US012332292B2

(12) United States Patent
Verma et al.

(10) Patent No.: US 12,332,292 B2
(45) Date of Patent: Jun. 17, 2025

(54) SYSTEM FOR LOCATING POWER FAULTS BASED ON A DIRECTION OF CURRENT FLOW

(71) Applicant: Cummins Power Generation Inc., Minneapolis, MN (US)

(72) Inventors: Shubhranshu Verma, Shoreview, MN (US); John Dorough, Lino Lakes, MN (US); Der Ueng Lee, Roseville, MN (US); Saklain Karim, Fridley, MN (US); Mark H. Schultz, Minneapolis, MN (US)

(73) Assignee: Cummins Power Generation Inc., Minneapolis, MN (US)

( * ) Notice: Subject to any disclaimer, the term of this patent is extended or adjusted under 35 U.S.C. 154(b) by 249 days.

(21) Appl. No.: 18/057,122

(22) Filed: Nov. 18, 2022

(65) Prior Publication Data
US 2024/0168074 A1    May 23, 2024

(51) Int. Cl.
*G01R 31/08* (2020.01)
*G01R 25/00* (2006.01)
(Continued)

(52) U.S. Cl.
CPC ........... *G01R 31/081* (2013.01); *G01R 25/00* (2013.01); *H02H 1/0007* (2013.01); *H02H 7/20* (2013.01)

(58) Field of Classification Search
CPC .... G01R 25/00; G01R 31/081; G01R 31/086; G01R 31/00; G01R 31/08; G01R 19/00; G01R 19/0084; G01R 19/0092; H02H 1/0007; H02H 7/20; H02H 7/261; H02H 3/081; H02H 3/38; H02H 3/382;
(Continued)

(56) References Cited

U.S. PATENT DOCUMENTS 3,949,272 A    4/1976   Smith
4,321,645 A    3/1982   Thom et al.
(Continued)

FOREIGN PATENT DOCUMENTS

| CA | 2186988 | 4/1997 | |
| CN | 107271840 A * | 10/2017 | ............. G01R 31/08 |
| WO | WO-2013038176 A2 * | 3/2013 | ............. G01R 1/203 |

OTHER PUBLICATIONS

Griffin et al., "Generator Ground Fault Protection Using Overcurrent, Overvoltage, and Undervoltage Relays", IEEE Transactions on Power Apparatus and Systems, Dec. 1982, pp. 4490-4501.
(Continued)

*Primary Examiner* — Hoai-An D. Nguyen
(74) *Attorney, Agent, or Firm* — Foley & Lardner LLP

(57) ABSTRACT

Systems and methods, and computing platforms for determining a fault in a power system, executing on a controller are disclosed. Exemplary implementations can receive, from the plurality of system control modules, a plurality of power flow directions as measured by the plurality of line current sensors, receive, from the plurality of system control modules, a plurality of voltage measurements based on measurements of a plurality of potential transformers, determine a location of a power fault using the plurality of power flow directions, and determine a phase of the power fault using the plurality of voltage measurements.

20 Claims, 20 Drawing Sheets

(51) Int. Cl.
*H02H 1/00* (2006.01)
*H02H 7/20* (2006.01)

(58) Field of Classification Search
CPC .. H02H 7/28; H02H 1/00; H02H 3/00; H02H 7/00; H02H 7/26
USPC ........ 324/500, 512, 522, 600, 649, 691, 713
See application file for complete search history.

(56) References Cited

U.S. PATENT DOCUMENTS

| | | | |
|---|---|---|---|
| 4,862,308 | A * | 8/1989 | Udren ................. H02H 3/50 |
| | | | 361/87 |
| 6,711,512 | B2 * | 3/2004 | Noh ................... H02H 1/0084 |
| | | | 702/65 |
| 6,731,098 | B1 | 5/2004 | Hintz et al. |
| 7,692,332 | B2 | 4/2010 | Nordman et al. |
| 7,719,285 | B2 | 5/2010 | Johansson et al. |
| 7,995,315 | B2 | 8/2011 | Riley et al. |
| 8,405,940 | B2 | 3/2013 | Schweitzer et al. |
| 8,547,668 | B2 | 10/2013 | Dahlen |
| 8,590,033 | B2 | 11/2013 | Schleiss et al. |
| 9,500,710 | B2 | 11/2016 | Thompson et al. |
| 9,837,812 | B2 | 12/2017 | Valdes et al. |
| 11,016,135 | B2 | 5/2021 | Verma et al. |
| 2003/0071633 | A1 * | 4/2003 | Fedirchuk ............. H02H 3/28 |
| | | | 324/529 |
| 2004/0010349 | A1 | 1/2004 | Perez et al. |
| 2010/0008000 | A1 | 1/2010 | Riley et al. |
| 2011/0018340 | A1 | 1/2011 | Patterson |
| 2011/0148214 | A1 | 6/2011 | Dahlen |
| 2012/0147508 | A1 | 6/2012 | Starkweather |
| 2018/0323611 | A1 | 11/2018 | Gubba Ravikumar |
| 2019/0081582 | A1 | 3/2019 | Rozman et al. |
| 2019/0245343 | A1 | 8/2019 | Porter et al. |
| 2020/0064391 | A1 * | 2/2020 | Dase ................... G01R 31/085 |
| 2020/0141993 | A1 | 5/2020 | Nikic et al. |
| 2020/0166557 | A1 | 5/2020 | Verma et al. |
| 2020/0182934 | A1 | 6/2020 | Chai et al. |

OTHER PUBLICATIONS

International Search Report and Written Opinion for International Application No. PCT/US2019/063267, mail date Feb. 11, 2020, 11 pages.

Kumar et al., "A Fast and Scalable Protection Scheme for Distribution Networks with Distributed Generation", IEEE Transactions On Power Delivery, vol. 31, No. 1, Feb. 2016, pp. 67-75.

Non-Final Office Action on U.S. Appl. No. 16/202,571 Dtd Oct. 5, 2020.

Notice of Allowance on U.S. Appl. No. 16/202,571 Dtd Jan. 22, 2021.

Pierce, A.C., "Generator Ground Protection Guide", IEEE Transaction on Power Apparatus and Systems, vol. PAS-103, No. 7, Jul. 1984, pp. 1743-1748.

Pillai et al., "Grounding and Ground Fault Protection of Multiple Generator Installations on Medium-Voltage Industrial and Commercial Power Systems", IEEE Transactions on Industry Applications, vol. 40, No. 1, Jan./Feb. 2004, 26 pages.

Pope, J.W., "A Comparison of 100% Stator Ground Fault Protection Schemes for Generator Stator Windings", IEEE Transactions on Power Apparatus and Systems, Apr. 1984, pp. 832-840.

Rifaat, Rasheek M., "Consideration for Generator Ground Fault Protection in Mid Size Cogeneration Plants", IEEE, 1995, pp. 175-182.

Sortomme et al., "Microgrid Protection Using Communication-Assisted Digital Relays", IEEE Transactions on Power Delivery, vol. 25, No. 4, Oct. 2010, pp. 2789-2796.

* cited by examiner

SYSTEM FOR LOCATING POWER FAULTS BASED ON A DIRECTION OF CURRENT FLOW

TECHNICAL FIELD

The present disclosure relates to power systems for identifying power faults.

BACKGROUND

Many electric power systems include two or more generators for additional power, redundancy, and/or safety. Both businesses and households rely on electrical equipment powered from one-phase, two-phase, three-phase, or other suitable utility-provided alternating-current (AC) power sources.

SUMMARY

One aspect of the present disclosure relates to a power system for identifying power faults. The power system includes a plurality of line current sensors each disposed between a load bus and a power source, a plurality of system control modules, each operatively coupled to one or more of the plurality of line current sensors, and one or more controllers. The one or more controllers configured to receive, from the plurality of system control modules, a plurality of power flow directions as measured by the plurality of line current sensors, receive, from the plurality of system control modules, a plurality of voltage measurements based on measurements of a plurality of potential transformers, determine a location of a power fault using the plurality of power flow directions, and determine a phase of the power fault using the plurality of voltage measurements.

Another aspect of the present disclosure relates to a method of determining a fault in a power system, executing on a controller. The method includes receiving a first value of current flow from a first line current sensor, the first line current sensor electrically coupled between a generator bus and a load bus, receiving a second value of current flow from a second line current sensor, a second line current sensor electrically coupled between the generator bus and the load bus, receiving a first value of voltage from a first potential transformer, receiving a second value of voltage from a second potential transformer, determining a first direction of power flow in the first line current sensor using the first value of current flow, determining a second direction of power flow in the second line current sensor using the second value of current flow, determining a power fault is located on one of the generator bus of the power system or the load bus of the power system based on the first direction of power flow and the second direction of power flow, and determining a phase of the power fault is located on one of the generator bus of the power system or load bus of the power system based on the first value of voltage and the second value of voltage.

Yet another aspect of the present disclosure is a control system for a power system for identifying phases of power faults. The control system includes comprising one or more controllers comprising a processing circuit configured to receive, from the system control modules, respective power flow directions as measured by a first line current sensor and a second current line sensor, receive, from the system control modules, respective voltage measurements as measured by a first potential transformer and a second potential transformer, and determine a potential phase of the power fault based on the respective voltage measurements at the first line current sensor and the second current line sensor.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

DETAILED DESCRIPTION

Following below are detailed descriptions of various concepts related implementations described herein relate generally to systems and methods for ground fault detection in power systems using a communication network. In some implementations, the systems and methods presented can allow for the accommodation of different types of switchgear potentially from different vendors. In some implementations, the systems and methods presented can allow for the elimination of requirements to add summing modules as there is no hardwire interconnection required between generators and switchgear systems. In some implementations, the systems and methods presented can allow for detection of a phase and location of a fault within a power system without requiring additional equipment and their associated costs.

The circuits and systems described in the figures are for example purpose only. It should be apparent to a person of skill in the art that other circuits and systems demonstrating one or more of the solutions discussed are possible and that these solutions as well as the illustrated circuits and systems are scalable. Further, it should be apparent to a person of skill in the art that the circuits and systems discussed are adaptable to various configurations of the switchgear used. While circuits illustrating two different circuit topologies are illustrated and discussed, circuits and systems demonstrating one or more of the solutions discussed are not limited to these two circuit topologies.

Figure 1:
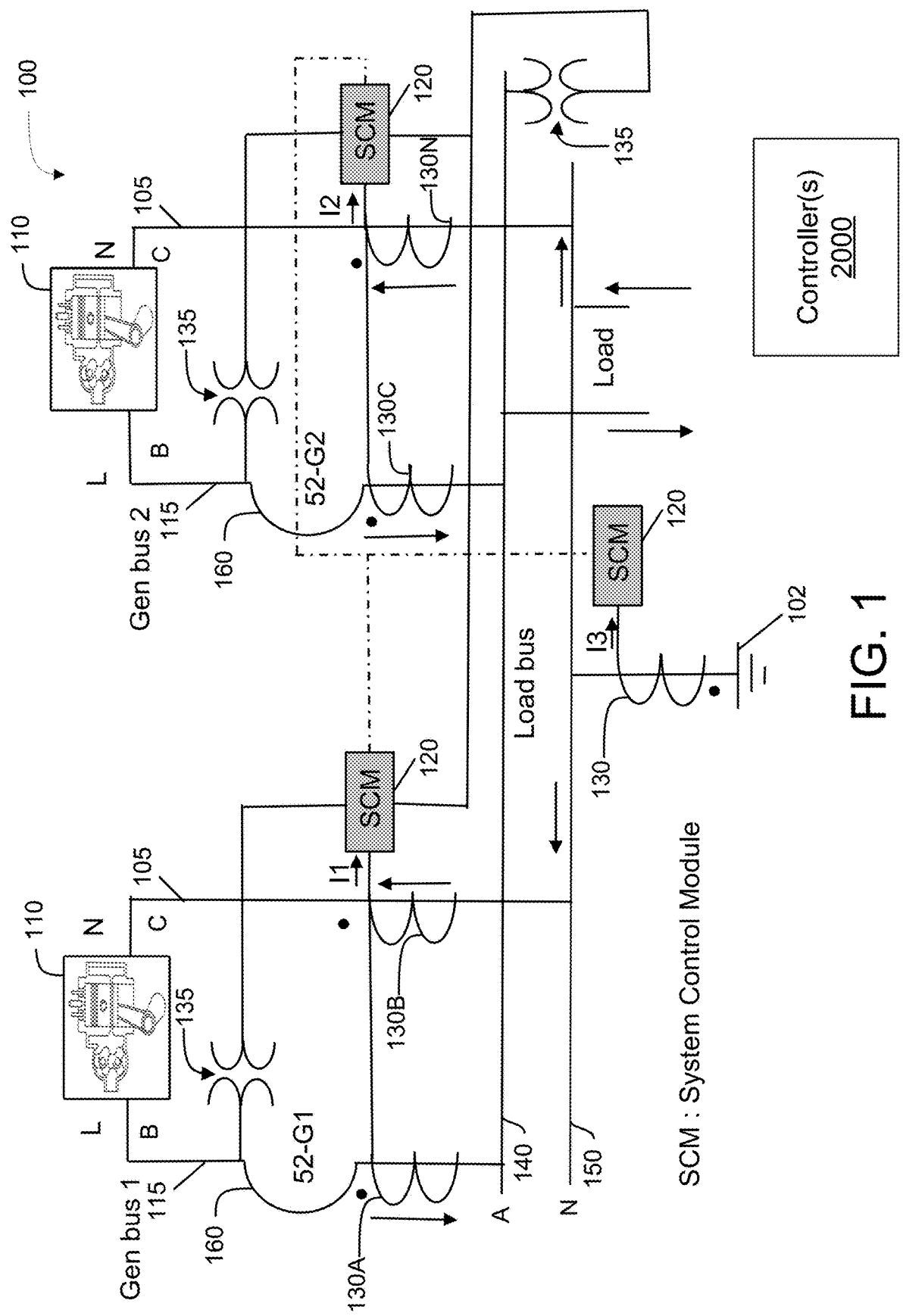
FIG. 1 is a schematic diagram showing normal power flow in a power system with a single point of ground according to an example implementation.

FIG. 1 is a schematic diagram showing normal power flow in a generator power system 100 utilizing System Control Modules (SCMs) for detecting bus and ground faults currents according to an example implementation. The power system 100 includes a plurality of a plurality of line current sensors 130A, 130B, 130C, and 130N, which may be collectively referred to as line current sensors 130 herein, a plurality of system control modules 120, and one or more controllers 2000. The plurality of line current sensor 130 are disposed between a power source 110 and a load bus 140. The plurality of system control modules 120 are operatively coupled to one or more of the line current sensors 130. The controller(s) 2000 may be operatively connected to the system control modules 120.

The controller(s) 2000 may be configured to receive, from the plurality of system control modules 120, a plurality of power flow directions as measured by the plurality of line current sensors 130, receive, from the plurality of system control modules 120, a plurality of voltage measurements based on measurements of a plurality of potential transformers 135, determine a location of a power fault using the power flow directions, and determine a phase of the power fault using the voltage measurements.

A respective line current sensor 130 is between a neutral bus 150 of the power system 100 and each of a respective generator neutral bus 105 of each generator 110 of the plurality of generators. For example, the line current sensor 130B is electrically connected between the neutral bus 150 and each generator neutral bus 105. In such an embodiment, the controller(s) 2000 can be further configured to receive current values measured by the line current sensors 130 between the neutral bus and each of the respective neutral bus of each of the plurality of generators from the system control modules 120, determine the location of the power fault further based on respective directions of power flow at each of the line current sensors 130 between the neutral bus and each of the respective neutral bus of each of the plurality of generators, and determine the phase of the power fault further based on respective directions of power flow at each of the line current sensors 130 between the neutral bus and each of the respective neutral bus of each of the plurality of generators. Further, the controller(s) 2000 can be further configured to determine no power fault present in the power system 100 based on the respective directions of power flow at each respective line current sensor 130.

In one embodiments, the power system 100 includes a plurality of line current sensors 130A-130N. The plurality of line current sensors may include a first line current sensor 130A and a second line current sensor 130B. The first line current sensor 130A is electrically coupled between the power source (e.g., the generator 110) and the load bus 140 of the power system 100 through the generator load bus 115, and the second line current sensor 130B is electrically coupled between the power source (e.g., the generator 110) and the neutral bus 150 of the power system 100 through the generator neutral bus 105.

In such an embodiment, the controller(s) 2000 can further be configured to receive a first value of current flow from the first line current sensor 130A, receive a second value of current flow from the second line current sensor 130B, receive a first value of voltage from the a first potential transformer 135, and receive a second value of voltage from a second potential transformer 135. The controller(s) 2000 can further be configured to determine a first direction of power flow in the first line current sensor 130A using the first value of current flow and determine a second direction of power flow in the second line current sensor 130B using the second value of current flow. The controller(s) 2000 can further be configured to determine a power fault is located on one of the generator bus of the power system or the load bus 140 of the power system based on the first direction of power flow and the second direction of power flow and determine a phase of the power fault is located on one of the generator bus of the power system or load bus of the power system based on the first value of voltage and the second value of voltage.

In some embodiments, the one or more controllers 2000 can be further configured to, receive a third value of current flow from a third line current sensor 130C, the third line current sensor 130C may be electrically coupled on between a second generator bus and the load bus 140. In some embodiments, the one or more controllers 200 can also be configured to receive a third value of voltage from a potential transformer 135. In some embodiments, the one or more controllers 2000 can also be configured to determine a third direction of power flow in the third line current sensor 130C using the third value of current flow where determining the power fault is located on one of the generator bus of the power system 100 or the load bus 140 of the power system 100 is further based on the third direction of power flow and where determining a phase of the power fault is located on one of the generator bus of the power system or load bus of the power system 100 is further based on the third value of voltage.

In some embodiments, the one or more controllers 2000 can be further configured to determine if the power fault is located on the second generator bus of the power system. In some embodiments, the power system 100 can include a circuit breaker 160 installed on the generator bus, where the one or more controllers 2000 can be further configured to determine the power fault is located on the generator bus of the power system, and trip the circuit breaker installed on the generator bus of the power system if the controller determines that a power fault is located on the generator. Specifically, the controller may be configured to trip a respective circuit breaker operatively connected to the first bus of the power system or the second bus of the power system based on determining the phase of the power fault and the power fault is located on one of the first bus of the power system or the second bus of the power system. In some embodiments, the power system 100 includes a single grounding point while in other embodiments, the power system includes a plurality of grounding points as will be explained in more detail below. In some embodiments, the controllers 2000 is a controller which is integrated into one of the plurality of generators 110.

In some embodiments, such as the embodiment illustrated in FIG. 1, the power system 100 may include a single ground point 102. In some embodiments, the power system 100 may include multiple ground points. The power system 100 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g., three phase power). In an example implementation, power system 100 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed.

The voltage term 'V' used can be the average or rms voltage of the bus voltage and the line side voltage of the power generators 110. In case any of the voltage is zero then it can be ignored from the calculation. In some implementations, a voltage associated with the power generators can be measured between two lines (e.g., a line-to-line voltage $V_{LL}$). For example, the line-to-line voltages can include $V_{ab}$, $V_{bc}$, and $V_{ca}$ for the power system 100. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. In some embodiments, the various voltages (e.g., $V_{ab}$, $V_{bc}$, $V_{ca}$, $V_{an}$, $V_{bn}$, and $V_{cn}$) may be determined by the potential transformers 135 which are connected to one or more system control modules 120. It is noted that additional generators can be added to the common bus embodiment shown in FIG. 1 and are contemplated. It is also noted that the use of system control modules for detecting the location and phase of one or more faults in the power system 100 via the coupled current sensors 130 and the potential transformers 135. The system control modules 120 enables the use of power equipment from differing manufacturers, allowing the control to be independent of the system components.

FIG. 1 shows an example implementation of a common bus generator installation with normal current flow. Normal current flow can be analyzed in a controller (e.g., a computing device such as controller 2000 of FIG. 20). In some implementations, currents are analyzed with I1 representing the current flow through the line current sensors 130 on the line and neutral buses of the first generator with I1 being the vector sum of the currents shown. The system control module 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor, i.e., into the dot, and −ve indicates a negative current or power flow and relative magnitude).

Currents can be further analyzed with I2 representing the current flow through the line current sensors 130 on the line and neutral buses of the second generator with I2 being the vector sum of the currents shown. The system control module 120 communicatively coupled to these respective line current sensors 130 can be configured to communicate the current flow information to one or more other system control modules 120 and/or a controller (e.g., a computing device such as controller 2000). The controller can be configured to calculate the power flow through the line current sensors 130 on the line and neutral buses of the second generator as P2=$V_{ab}$*I2. The current is entering the line side line current sensor 130 through the 'dot'. The return current in the neutral current sensor 130 is opposite and leaving through the 'dot'.

Currents can be further analyzed with I3 representing the current flow through the line current sensor 130 on the bus connecting neutral to ground (N-G bond). The system control module 120 communicatively coupled to this respective line current sensor 130 can be configured to communicate the current flow information to one or more other system control modules 120 and/or a controller (e.g., a computing device such as controller 2000).

Under normal conditions when P1=P2=0, I3=0, and $V_{LL}=\sqrt{3}*V_{LN}$ for all three power phases, there is no power fault in the system.

Figure 2:
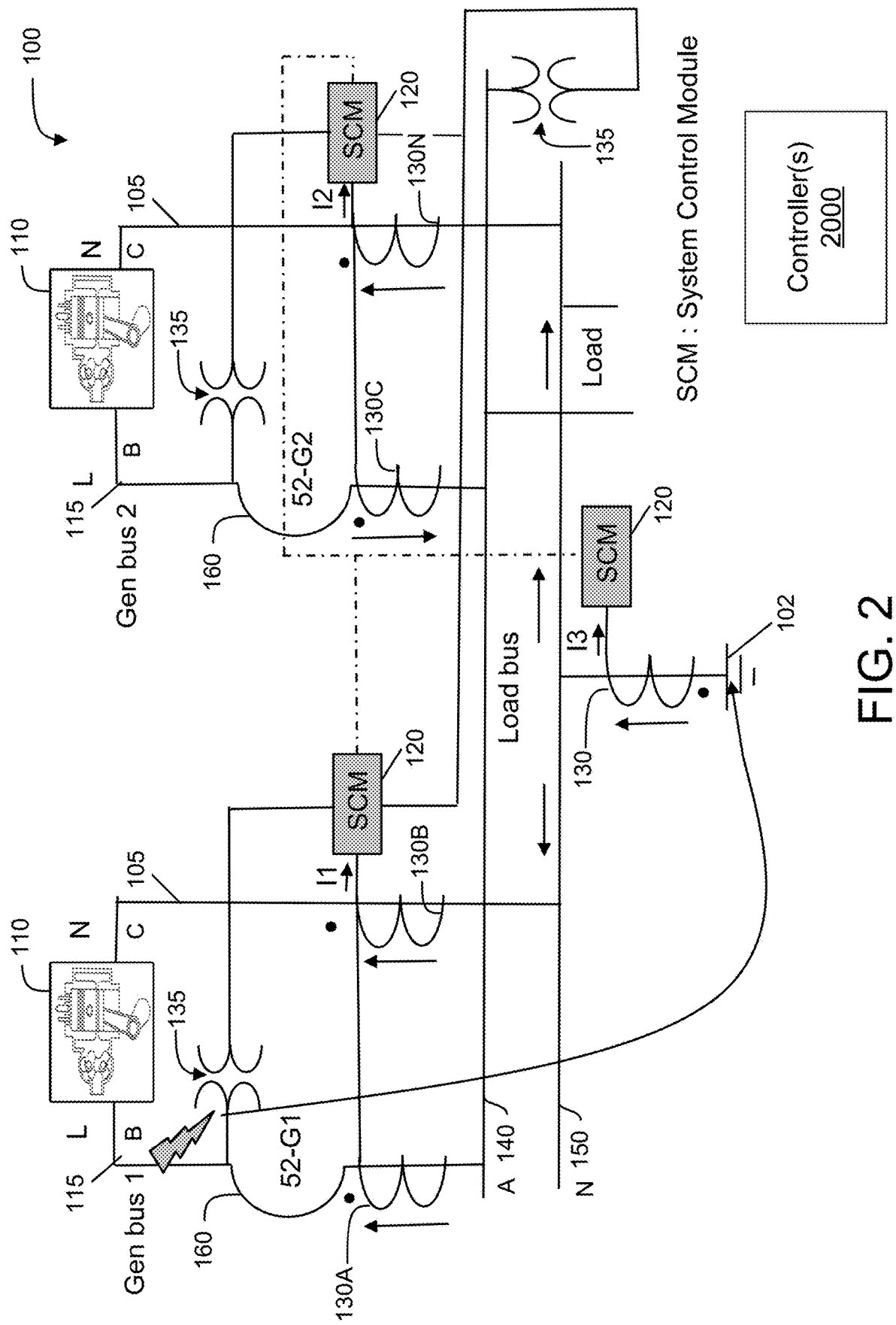
FIG. 2 is a schematic block diagram showing power flow with a ground fault on a first generator bus on a first phase in the power system of FIG. 1 according to an example implementation.

FIG. 2 is a schematic diagram showing current flow in the power system 100 with an illustrated power fault on the load bus line for the first generator 110 according to an example implementation. The power system 100 may include a single ground point 102. The power system 100 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g. three phase power). In an example implementation, power system 100 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used can be the average or rms voltage of the bus voltage and the line side voltage of the power generators 110. In case any of the voltage is zero then it can be ignored from the calculation.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 100. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 1 and are contemplated. It is also noted that the use of system control modules for detecting the location and phase of one or more faults in the power system 100 via the coupled current sensors 130 and the potential transformers 135. The system control modules 120 enables the use of power equipment from differing manufacturers, allowing the control to be independent of the system components.

Figure 20:
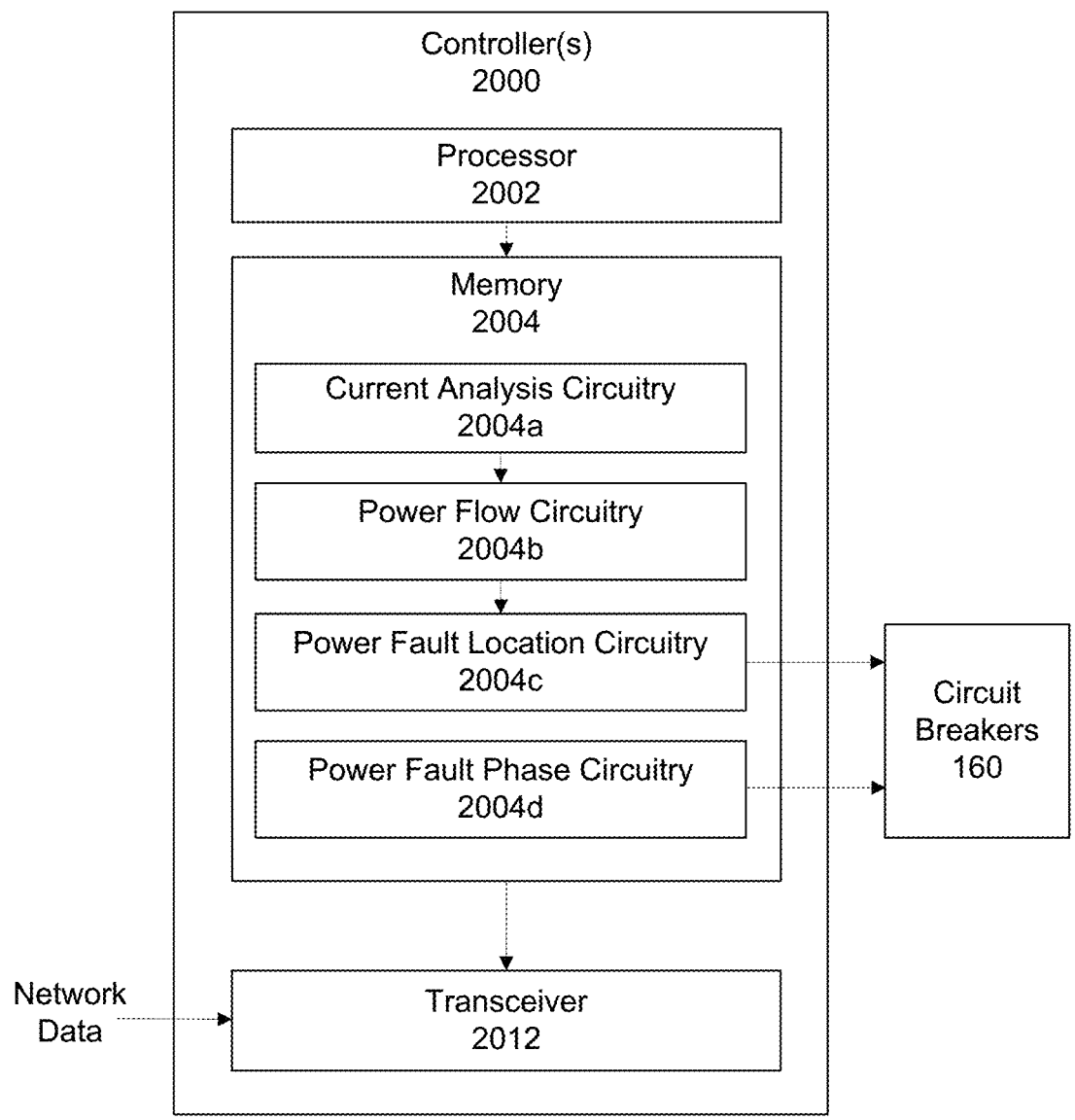
FIG. 20 is a schematic block diagram of an implementation of a controller which can be used as an example controller as part of various systems and methods of FIGS. 1-19.

FIG. 2 shows an example implementation with a power fault (short to ground) on the first generator (G1) load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=V*I1. The direction of the current on both the line side line current sensors 130 and the neutral current sensor 130 is same and it enters the line current sensors 130 from the other side of the 'dot'. Therefore, the total current I1 is considered –ve. Since the power fault is causing current to flow from the load bus 140 back to the first generator through the N-G bond and not the Neutral bus, this can be represented as –ve due to the missing current flow.

Currents can be further analyzed with I2 representing the current flow through the line current sensors 130 on the line and neutral buses of the second generator with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the second generator as P2=V*I2. The direction of currents in the line current sensor 130 and the neutral current sensor 130 is different and therefore they cancel each other out. Therefore, the current flowing from the second generator to a load bus 140 (e.g., I2) is zero.

Currents can be further analyzed with I3 representing the current flow through the line current sensor 130 on the bus connecting neutral to ground (N-G bond). The system control module 120 communicatively coupled to this respective line current sensor 130 can be configured to communicate the current flow information to one or more other system control modules 120 and/or a controller (e.g., a computing device such as controller 2000). Current flowing from the N-G bond (e.g., I3) can be represented as +ve as it enters the line current sensor 130 through the 'dot' and leaves the current sensor 130 from the other side.

The system control modules 120 can also determine one or more voltages of the power system 200. More specifically, the system control modules 120 can determine a voltage associated with each phase. As explained above, the voltage associated with the power generators can be measured between a phase and a neutral (e.g. a line to neutral voltage $V_{LN}$). Therefore, the first phase (e.g., phase A) can be associated with $V_{an}$, the second phase (e.g., phase B) can be associated with $V_{bn}$, and the third phase (e.g., phase C) can be associated with $V_{cn}$.

Under these fault conditions, since I1 is negative (e.g., –ve) P1 is also negative. Furthermore, since I2 is zero, P2 is also zero. Finally, as explained above, I3 is positive (+ve). The controller can be configured to determine that with this example configuration of components, the negative value of P1, the zero value of P2, and the positive value of I3 indicate the ground fault is on the line bus of the first generator (G1). In one embodiment, under these fault conditions, $V_{an}$ is zero, $V_{ab}$ and $V_{ca}$ are equal to $V_{LN}$, and $V_{bc}$ is equal to $V_{LL}$. The controller can be configured to determine that with this example configuration of components, the zero value of $V_{an}$, $V_{ab}$ and $V_{ca}$ being equal to $V_{LN}$, and $V_{bc}$ being equal to $V_{LL}$ indicates a fault on the first phase (e.g., phase A) of the power system 200. In another embodiment, under these fault conditions, $V_{bn}$ is zero, $V_{ab}$ and $V_{bc}$ are equal to $V_{LN}$, and $V_{ca}$ is equal to $V_{LL}$. The controller can be configured to determine that with this example configuration of components, the zero value of $V_{bn}$, $V_{ab}$ and $V_{bc}$ being equal to $V_{LN}$, and $V_{ca}$ being equal to $V_{LL}$ indicates a fault on the second phase (e.g., phase B) of the power system 200. In another embodiment, under these fault conditions, $V_{cn}$ is zero, $V_{ca}$ and $V_{bc}$ are equal to $V_{LN}$, and $V_{ab}$ is equal to $V_{LL}$. The controller can be configured to determine that with this example configuration of components, the zero value of $V_{cn}$, $V_{ca}$ and $V_{bc}$ being equal to $V_{LN}$, and $V_{ab}$ being equal to $V_{LL}$ indicates a fault on the third phase (e.g., phase C) of the power system 200. In some implementations, the controller is configured to transmit an alarm and/or alarm condition. In some implementations, the controller is configured to trip the associated breaker 160 in cases where the ground fault current is above the pickup value of the ground fault current.

Figure 3:
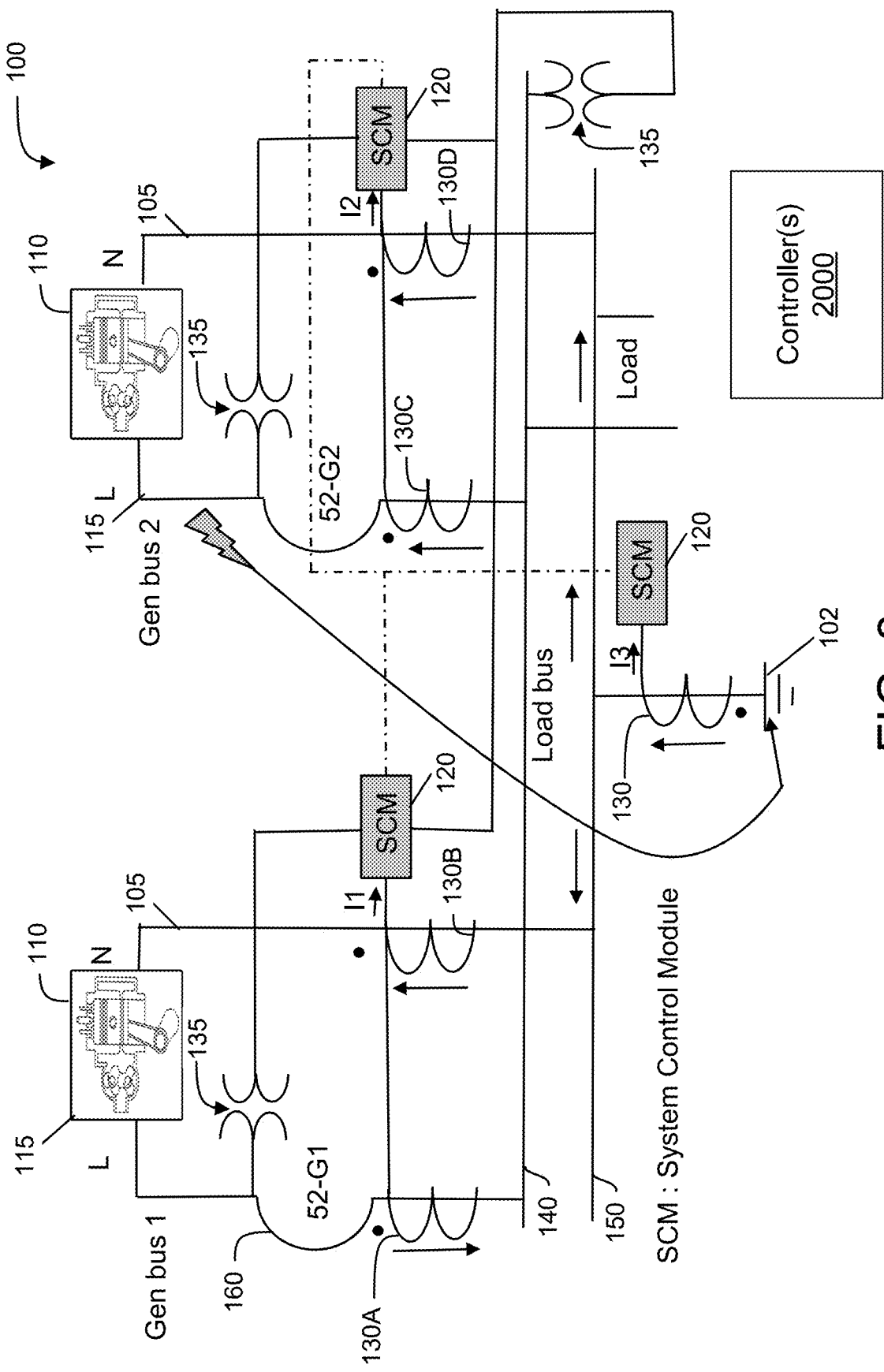
FIG. 3 is a schematic block diagram showing power flow with a ground fault on a second generator bus on a second phase in the power system of FIG. 1 according to an example implementation.

FIG. 3 is a schematic diagram showing current flow in the power system 100 with an illustrated power fault on the load bus line for the second generator 110 according to an example implementation. The power system 100 may include a single ground point 102. The power system 100 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g. three phase power). In an example implementation, power system 100 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used can be the average or rms voltage of the bus voltage and the line side voltage of the power generators 110. In case any of the voltage is zero then it can be ignored from the calculation.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 100. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 3 and are contemplated. It is also noted that the use of system control modules for detecting the location and phase of one or more faults in the power system 100 via the coupled current sensors 130 and the potential transformers 135. The system control modules 120 enables the use of power equipment from differing manufacturers, allowing the control to be independent of the system components FIG. 3 shows an example implementation with a power fault (short to ground) on the second generator load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=V*I1. The direction of currents in the line current sensor 130 and the neutral current sensor 130 is different and therefore they cancel each other out. Therefore, the current flowing from the first generator to a load bus 140 (e.g., I1) is zero.

The controller can be configured to calculate the power flow through the line current sensors 130 on the line and neutral buses of the second generator as P2=V*I2. Currents can be further analyzed with I2 representing the current flow through the line current sensors 130 on the line and neutral buses of the second generator with I2 being the vector sum of the currents shown. The direction of the current on both the line side line current sensors 130 and the neutral current sensor 130 is same and it enters the line current sensors 130 from the other side of the 'dot'. Therefore, the total current I2 is considered –ve. Since the power fault is causing current to flow from the load bus 140 back to the first generator through the N-G bond and not the Neutral bus, this can be represented as –ve due to the missing current flow. The system control modules 120 communicatively coupled to these respective line current sensors 130 can be configured to communicate the current flow information to one or more other system control modules 120 and/or a controller (e.g., a computing device such as controller 2000).

Currents can be further analyzed with I3 representing the current flow through the line current sensor 130 on the bus connecting neutral to ground (N-G bond). The system control module 120 communicatively coupled to this respective line current sensor 130 can be configured to communicate the current flow information to one or more other system control modules 120 and/or a controller (e.g., a computing device such as controller 2000). Current flowing from the N-G bond (e.g., I3) can be represented as +ve as it enters the line current sensor 130 through the 'dot' and leaves the current sensor 130 from the other side.

The system control modules 120 can also determine one or more voltages of the power system 200. More specifically, the system control modules 120 can determine a voltage associated with each phase. As explained above, the voltage associated with the power generators can be measured between a phase and a neutral (e.g. a line to neutral voltage $V_{LN}$). Therefore, the first phase (e.g., phase A) can be associated with $V_{an}$, the second phase (e.g., phase B) can be associated with $V_{bn}$, and the third phase (e.g., phase C) can be associated with $V_{cn}$.

Under these fault conditions, since I2 is negative (e.g., –ve) P2 is also negative. Furthermore, since I1 is zero, P1 is also zero. Finally, as explained above, I3 is positive (+ve). The controller can be configured to determine that with this example configuration of components, the negative value of P2, the zero value of P1, and the positive value of I3 indicate the ground fault is on the line bus of the second generator. In one embodiment, under these fault conditions, the system control module 120 closest to the second generator can determine that $V_{bn}$ is zero, $V_{an}$, $V_{cn}$, $V_{ab}$, and $V_{bc}$, are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$, and $V_{bc}$ being equal to $V_{LN}$, and $V_{ca}$ being equal to $V_{LL}$ indicates a fault on the second (e.g., phase B) of the power system 100. In another embodiment, under these fault conditions, the system control module 120 closest to the second generator can determine that $V_{an}$ is zero, $V_{bn}$, $V_{cn}$, $V_{ab}$, and $V_{ca}$, are equal to $V_{LN}$, and $V_{bc}$ is equal to $V_{LL}$. The controller can be configured to determine that with this example configuration of components, $V_{an}$ being equal to zero, $V_{cn}$, $V_{cn}$, $V_{ab}$, and $V_{bc}$ being equal to $V_{LN}$, and $V_{ca}$ being equal to $V_{LL}$ indicates a fault on the second (e.g., phase B) of the power system 100. The controller can be configured to determine that with this example configuration of components, $V_{cn}$ being equal to zero, $V_{ca}$ and $V_{bc}$ being equal to $V_{LN}$, and $V_{ab}$ being equal to $V_{LL}$ indicates a fault on the third phase (e.g., phase C) of the power system 200. In some implementations, the controller is configured to transmit an alarm and/or alarm condition. In some implementations, the controller is configured to trip the associated breaker 160 in cases where the ground fault current is above the pickup value of the ground fault current.

Figure 4:
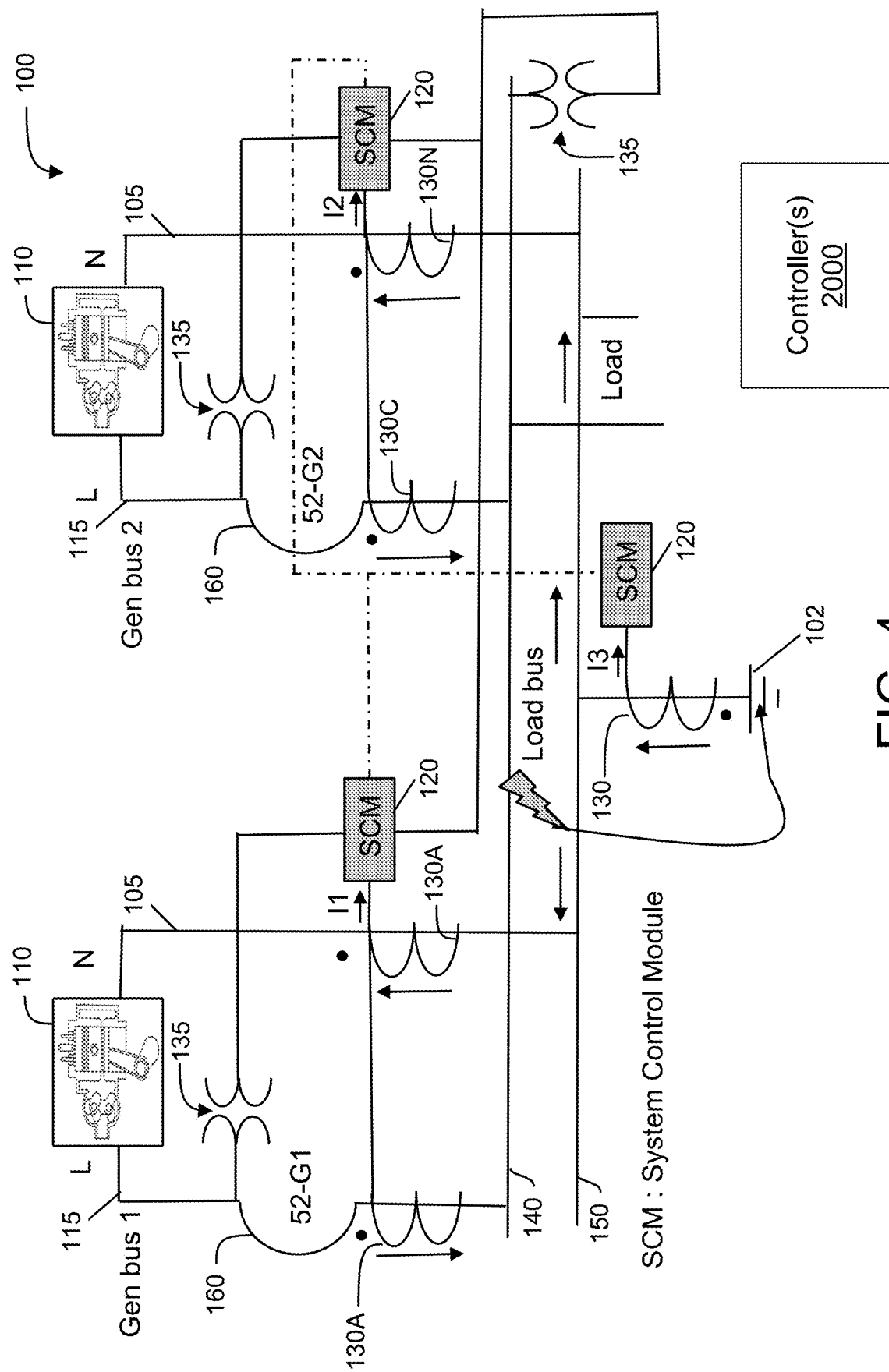
FIG. 4 is a schematic block diagram showing power flow with a ground fault on a load bus on a third phase in the power system of FIG. 1 according to an example implementation.

FIG. 4 is a schematic diagram showing current flow in the power system 100 with an illustrated power fault on the load bus according to an example implementation. The power system 100 may include a single ground point 102. The power system 100 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g. three phase power). In an example implementation, power system 100 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used can be the average or rms voltage of the bus voltage and the line side voltage of the power generators 110. In case any of the voltage is zero then it can be ignored from the calculation.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 100. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 4 and are contemplated. It is also noted that the use of system control modules for detecting the location and phase of one or more faults in the power system 100 via the coupled current sensors 130 and the potential transformers 135. The system control modules 120 enables the use of power equipment from differing manufacturers, allowing the control to be independent of the system components FIG. 4 shows an example implementation with a power fault (short to ground) on the load bus 140 compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=V*I1. The direction of currents in the line current sensor 130 and the neutral current sensor 130 is different and therefore they cancel each other out. Therefore, the current flowing from the first generator to a load bus 140 (e.g., I1) is zero.

The controller can be configured to calculate the power flow through the line current sensors 130 on the line and neutral buses of the second generator as P2=V*I2. Currents can be further analyzed with I2 representing the current flow through the line current sensors 130 on the line and neutral buses of the second generator with I2 being the vector sum of the currents shown. The direction of currents in the line current sensor 130 and the neutral current sensor 130 is different and therefore they cancel each other out. Therefore, the current flowing from the second generator to a load bus 140 (e.g., I2) is zero. Since I2 is zero, P2 is also zero. The system control modules 120 communicatively coupled to these respective line current sensors 130 can be configured to communicate the current flow information to one or more other system control modules 120 and/or a controller (e.g., a computing device such as controller 2000).

Currents can be further analyzed with I3 representing the current flow through the line current sensor 130 on the bus connecting neutral to ground (N-G bond). The system control module 120 communicatively coupled to this respective line current sensor 130 can be configured to communicate the current flow information to one or more other system control modules 120 and/or a controller (e.g., a computing device such as controller 2000). Current flowing from the N-G bond (e.g., I3) can be represented as +ve as it enters the line current sensor 130 through the 'dot' and leaves the current sensor 130 from the other side.

The system control modules 120 can also determine one or more voltages of the power system 200. More specifically, the system control modules 120 can determine a voltage associated with each phase. As explained above, the voltage associated with the power generators can be measured between a phase and a neutral (e.g. a line to neutral voltage $V_{LN}$). Therefore, the first phase (e.g., phase A) can be associated with $V_{an}$, the second phase (e.g., phase B) can be associated with $V_{bn}$, and the third phase (e.g., phase C) can be associated with $V_{cn}$.

Under these fault conditions, P1 and P2 is zero and I3 is positive (+ve). The controller can be configured to determine that with this example configuration of components, the zero value of P1 and P2, and the positive value of I3 indicate the ground fault on the load bus 140. In one embodiment, under these fault conditions, the system control module 120 closest to the load bus 140 can determine that $V_{cn}$ is zero, $V_{an}$, $V_{bn}$, $V_{ca}$, and $V_{bc}$, are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$, and $V_{ab}$ being equal to $V_{LN}$, and $V_{bc}$ being equal to $V_{LL}$ indicates a fault on the first phase (e.g., phase C) of the power system 100. In another embodiment, under these fault conditions, the system control module 120 closest to the load bus 140 can determine that $V_{an}$ is zero, $V_{bn}$, $V_{cn}$, $V_{ab}$, and $V_{ca}$, are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 100. The controller can be configured to determine that with this example configuration of components, $V_{bn}$ being equal to zero, $V_{ca}$ and $V_{bc}$ being equal to $V_{LN}$, and $V_{ab}$ being equal to $V_{LL}$ indicates a fault on the second phase (e.g., phase B) of the power system 100. In some implementations, the controller is configured to transmit an alarm and/or alarm condition. In some implementations, the controller is configured to trip the associated breaker 160 in cases where the ground fault current is above the pickup value of the ground fault current. Various scenarios as illustrated in FIGS. 1-4 for power flow are summarized in the following table:

|  | Normal Voltages and Current | Fault on Load Bus, Phase A | Fault on Generator 1, Phase B | Fault on Generator 2, Phase C |
|---|---|---|---|---|
| $V_{an}$ | $V_{LN}$ | 0 | $V_{LN}$ | $V_{LN}$ |
| $V_{bn}$ | $V_{LN}$ | $V_{LN}$ | 0 | $V_{LN}$ |
| $V_{cn}$ | $V_{LN}$ | $V_{LN}$ | $V_{LN}$ | 0 |
| $V_{ab}$ | $V_{LL}$ | $V_{LN}$ | $V_{LN}$ | $V_{LL}$ |
| $V_{bc}$ | $V_{LL}$ | $V_{LL}$ | $V_{LN}$ | $V_{LN}$ |
| $V_{ca}$ | $V_{LL}$ | $V_{LN}$ | $V_{LL}$ | $V_{LN}$ |
| P1 | 0 | 0 | −ve | 0 |
| P2 | 0 | 0 | 0 | −ve |
| I3 | 0 | +ve | +ve | +ve |

Figure 5:
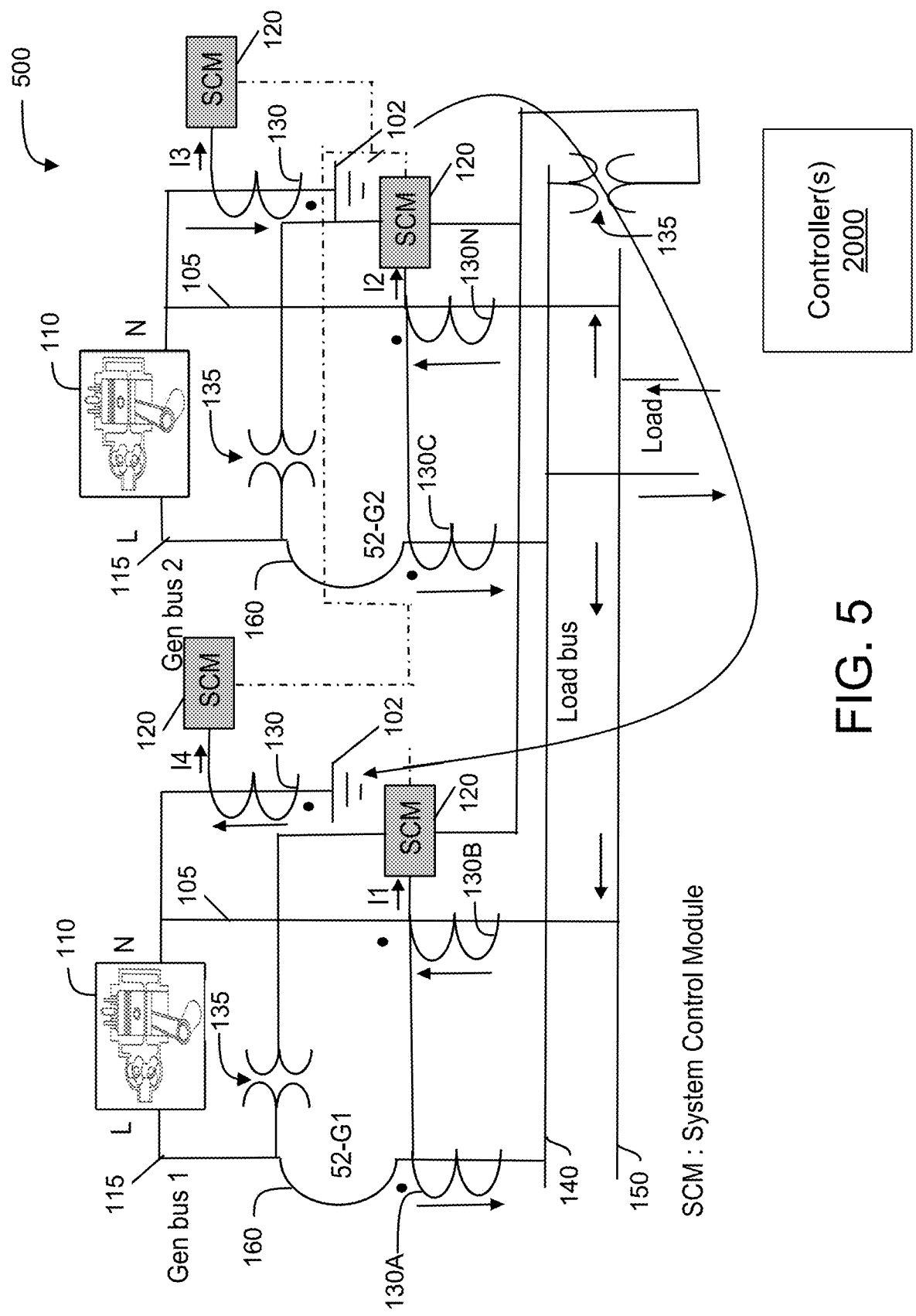
FIG. 5 is a schematic diagram showing normal power flow in a power system with multiple points of ground according to an example implementation.

FIG. 5 is a schematic diagram showing normal power flow in a power system 500 utilizing system control modules (SCMs) for sensing bus and ground fault currents according to an example implementation. In some embodiments, such as the embodiment illustrated in FIG. 5, the power system 500 may include a multiple ground points 102. In some embodiments, the power system 500 may include a single ground point. The power system 500 shows two power generators 110 each with a corresponding generator bus, various line current sensors 130 (e.g., current transducers), system control modules 120 communicatively coupled to one or more of the line current sensors 130, circuit breakers 160, potential transformers 135, a load bus 140, and a neutral bus 150. Each bus can represent one or more phases of power (e.g. three phase power). In an example implementation, power system 500 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed.

The voltage term 'V' used can be the average or rms voltage of the bus voltage and the line side voltage of the power generators 110. The voltage term 'V' used can be the average or rms voltage of the bus voltage and the line side voltage of the power generators 110. In case any of the voltage is zero then it can be ignored from the calculation. In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 100. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 5 and are contemplated. It is also noted that the use of system control modules for detecting the location and phase of one or more faults in the power system 100 via the coupled current sensors 130 and the potential transformers 135. The system control modules 120 enables the use of power equipment from differing manufacturers, allowing the control to be independent of the system components.

FIG. 5 shows an example implementation of a common bus generator installation with normal current flow. Normal current flow can be analyzed in a controller (e.g., a computing device such as controller 2000 of FIG. 20). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. Some of the return current flows through the N-G bond on the G2 (current I3) and N-G bond on the G1 (current I4), particularly when fault conditions are present. As there will be +ve difference sensed in the outgoing current between the line (L) side line current sensors 130 and the returning current on the neutral current (N) sensors 130 of first generator (G1), the total current I1 is considered +ve. Current flowing from the first generator to a load bus 140 can be represented as +ve.

Currents can be further analyzed with I2 representing the current flow through the line current sensors 130 on the line and neutral buses of the second generator with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the second generator as $P2=V_{ab}*I2$. The current is entering the line side line current sensor 130 through the 'dot'. The return current in the neutral current sensor 130 is opposite and leaving through the 'dot'. The current through the neutral is more than the line current because some of the G1 current which flows through the Neutral-Ground(N-G) bonds for G1 and G2 also flows through the neutral current sensor 130 of the G2 (see FIG. 1). Therefore, there will be negative difference in currents between the outgoing line (L) side line current sensors 130 and the returning neutral current (N) sensor 130 of the G2. Therefore, I2 can be considered −ve. Current flowing from the second generator to a load bus 140 can be represented as −ve.

Currents can be further analyzed with I4 representing the current flow through the line current sensor 130 on the bus connecting neutral to ground (N-G bond) for the first generator. The system control module 120 communicatively coupled to this respective line current sensor 130 can be configured to communicate the current flow information to one or more other system control modules 120 and/or a controller (e.g., a computing device such as controller 2000).

Return current flowing from the neutral bus 150 to the N-G bond of G2, to the N-G bond of G1, to G1 is considered +ve as it enters the N-G bond of G1 through the 'dot'.

Currents can be further analyzed with I3 representing the current flow through the line current sensor 130 on the bus connecting neutral to ground for the second generator. The high-speed system control modules 120 communicatively coupled to this respective line current sensor 130 can be configured to communicate the current flow information to one or more other high-speed system control modules 120 and/or a controller (e.g., a computing device such as controller 2000).

Return current flow from the load to the neutral bus 150, to the N-G bond of G2 is considered −ve as it leaves the N-G CT of G2 through the 'dot'. This current eventually returns to G1 through N-G bond on G1.

Under normal conditions when P1+P2=0, I3+I4 is zero, and $V_{LL}=\sqrt{3}*V_{LN}$ for all three power phases there is no power fault in the system.

Figure 6:
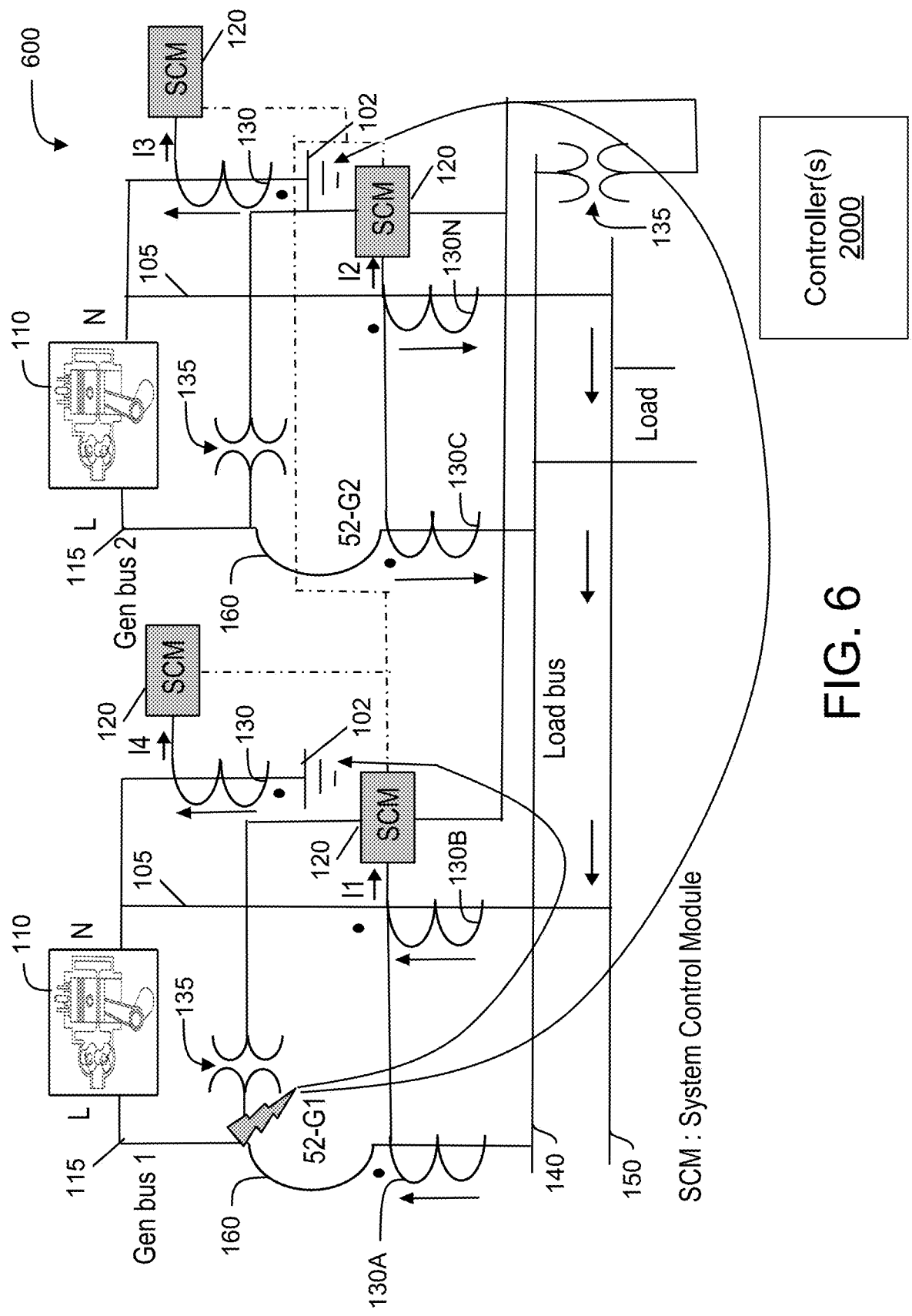
FIG. 6 is a schematic block diagram showing power flow with a ground fault on a first generator bus on a first phase in the power system of FIG. 5 according to an example implementation.

FIG. 6 is a schematic diagram showing current flow in the power system 500 with an illustrated power fault on the load bus line for the first generator 110 according to an example implementation. The power system 500 may include multiple ground points 102. The power system 500 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g. three phase power). In an example implementation, power system 500 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used can be the average or rms voltage of the bus voltage and the line side voltage of the power generators 110. In case any of the voltage is zero then it can be ignored from the calculation.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 500. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 6 and are contemplated. It is also noted that the use of system control modules for detecting the location and phase of one or more faults in the power system 500 via the coupled current sensors 130 and the potential transformers 135. The system control modules 120 enables the use of power equipment from differing manufacturers, allowing the control to be independent of the system components.

FIG. 6 shows an example implementation with a power fault (short to ground) on the first generator (G1) load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. The direction of the current on both the line side line current sensors 130 and the neutral current sensor 130 is same and it enters the line current sensors 130 from the other side of the 'dot'. Therefore, the total current I1 is considered −ve. Since the power fault is causing current to flow from the load bus 140 back to the first generator through the N-G bond and not the Neutral bus, this can be represented as −ve due to the missing current flow.

Currents can be further analyzed with I2 representing the current flow through the line current sensors 130 on the line and neutral buses of the second generator with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the second generator as $P2=V_{ab}*I2$. As shown on FIG. 5, the current enters the line current sensors 130 of the second generator through the 'dot' and goes back to the second generator through N-G bond of the second generator. Also, some of the first generator fault current also flows through the N-G of the second generator, to neutral bus 150 and back to first generator. This current enters the second generator neutral through the 'dot' and leave the first generator neutral current sensor 130 through the 'dot'. The direction of currents in both the line current sensor 130 and the neutral current sensor 130 is the same and therefore they can be added and considered +ve. Current flowing from the second generator to a load bus 140 can be represented as +ve.

Currents can be further analyzed with I3 representing the current flow through the line current sensor 130 on the bus connecting neutral to ground for the second generator. The system control module 120 communicatively coupled to this respective line current sensor 130 can be configured to communicate the current flow information to one or more other system control module 120 and/or a controller (e.g., a computing device such as controller 2000). Current flowing from the second generator N-G bond can be represented as +ve as it enters the line current sensor 130 through the 'dot' and leaves the CT from the other side.

Currents can be further analyzed with I4 representing the current flow through the line current sensor 130 on the bus connecting neutral to ground for the first generator. The system control module 120 communicatively coupled to this respective line current sensor 130 can be configured to communicate the current flow information to one or more other system control modules 120 and/or a controller (e.g., a computing device such as controller 2000). Current flowing from the second generator N-G bond can be represented as +ve as it enters the line current sensor 130 through the 'dot' and leaves the line current sensor 130 from the other side.

The system control modules 120 can also determine one or more voltages of the power system 200. More specifically, the system control modules 120 can determine a voltage associated with each phase. As explained above, the voltage associated with the power generators can be measured between a phase and a neutral (e.g. a line to neutral voltage $V_{LN}$). Therefore, the first phase (e.g., phase A) can be associated with $V_{an}$, the second phase (e.g., phase B) can be associated with $V_{bn}$, and the third phase (e.g., phase C) can be associated with $V_{cn}$.

Under these fault conditions, P1 can therefore be represented as −ve, P2 as +ve, I3 as +ve, and I4 as +ve. The controller can be configured to determine that with this example configuration of components, the negative value of P1 along with positive values of P2, I3 and I4 indicate the ground fault is on the line bus of the first generator (G1). In one embodiment, under these fault conditions, the system control module 120 closest to the first generator can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 200. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 200. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 200. In some implementations, the controller is configured to transmit an alarm and/or alarm condition. In some implementations, the controller is configured to trip the associated breaker 160 in cases where the ground fault current is above the pickup value of the ground fault current.

Figure 7:
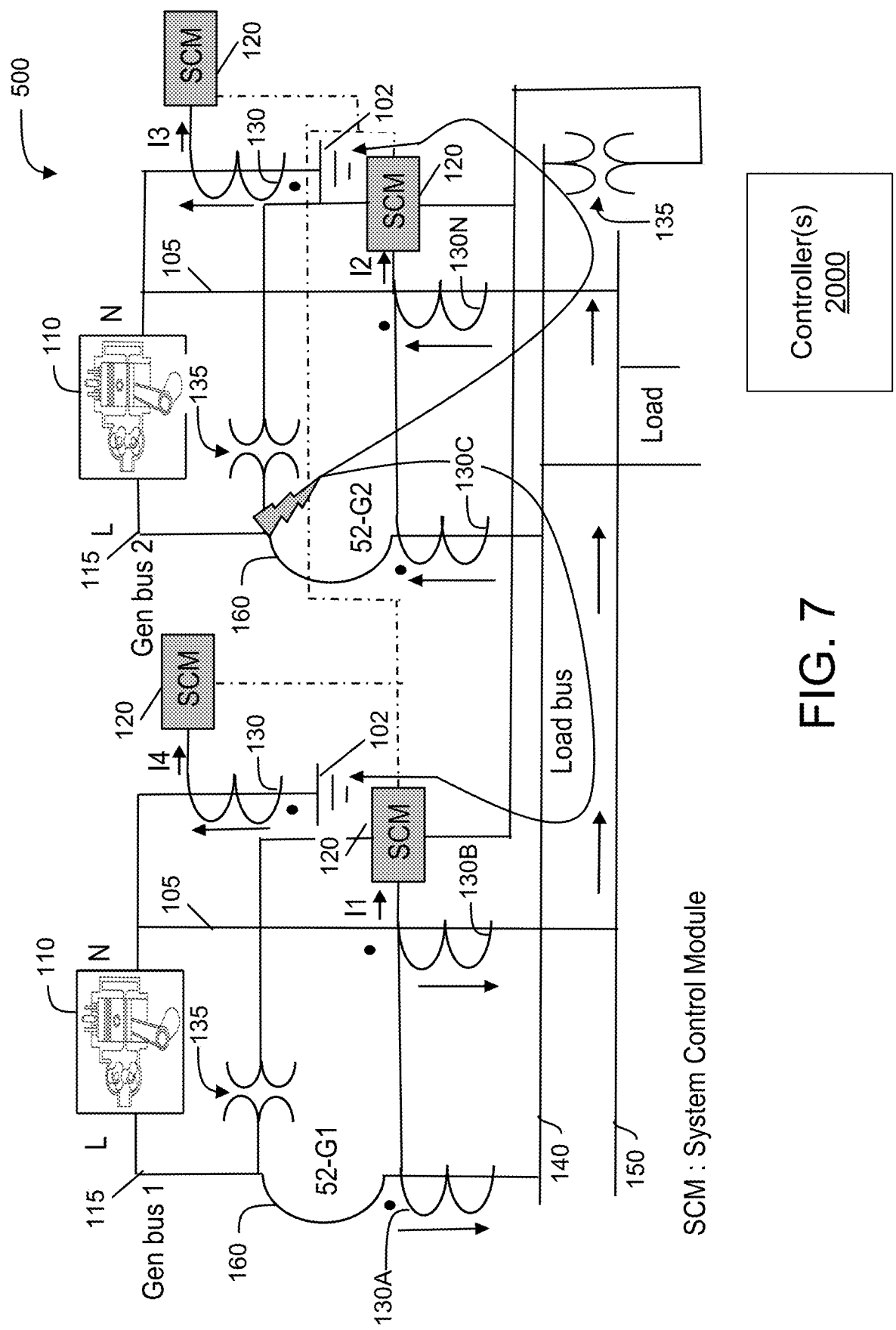
FIG. 7 is a schematic block diagram showing power flow with a ground fault on a second generator bus on a second phase in the power system of FIG. 5 according to an example implementation.

FIG. 7 is a schematic diagram showing current flow in the power system 500 with an illustrated power fault on the load bus line for the first generator 110 according to an example implementation. The power system 500 may include multiple ground points 102. The power system 500 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g. three phase power). In an example implementation, power system 500 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used can be the average or rms voltage of the bus voltage and the line side voltage of the power generators 110. In case any of the voltage is zero then it can be ignored from the calculation.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 500. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 7 and are contemplated. It is also noted that the use of system control modules for detecting the location and phase of one or more faults in the power system 500 via the coupled current sensors 130 and the potential transformers 135. The system control modules 120 enables the use of power equipment from differing manufacturers, allowing the control to be independent of the system components.

FIG. 7 shows an example implementation with a power fault (short to ground) on the second generator load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. Current flows into the fault from 'dot' side of the line current sensors 130 of 52-G1 to load bus 140, to 52-G2 line side current sensors 130 (leaving the 52-G2 current sensors 130 through the 'dot') and return to the first generator through the N-G bond on the first generator. As the current does not return through the neutral current sensor 130 of the 52-G1, the vector sum of the line current sensors 130 current and the neutral current on 52-G1 current sensors 130 will be positive. Since the power fault is causing current to flow from the first generator to the load bus 140 back to the first generator, this can be represented as +ve.

Currents can be further analyzed with I2 representing the current flow through the line current sensors 130 on the line and neutral buses of the second generator with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the second generator as $P2=V_{ab}*I2$. Current flows from the second generator to the power fault bypass the line side current sensors 130 of the second generator. Part of the return current flows through the N-G bond on the second generator and rest of the return current flows through the N-G bond of the first generator, to the neutral (N) current sensor 130 of the first generator through the 'dot' side, to the neutral current sensor 130 of the second generator through the side opposite to the 'dot' and back to the second generator. Current in the line side current sensors 130 of the second generator is the fault current supplied by first generator and it flows into the fault through the line side current sensors 130 of the second generator, from the side opposite to the 'dot'. The currents in the line side current sensors 130 and neutral sensor on second generator add up and considered −ve as they enter the current sensors 130 from the opposite end of the 'dot'. Current flowing from the second generator to a load bus 140 (e.g., I2) can be represented as −ve.

Currents can be further analyzed with I3 representing the current flow through the line current sensor 130 on the bus connecting neutral to ground for the second generator. The system control module 120 communicatively coupled to this respective line current sensor 130 can be configured to communicate the current flow information to one or more other system control module 120 and/or a controller (e.g., a computing device such as controller 2000). Current flowing from the second generator N-G bond can be represented as +ve as it enters the line current sensor 130 through the 'dot' and leaves the CT from the other side.

Currents can be further analyzed with I4 representing the current flow through the line current sensor 130 on the bus connecting neutral to ground for the first generator. The system control module 120 communicatively coupled to this respective line current sensor 130 can be configured to communicate the current flow information to one or more other system control modules 120 and/or a controller (e.g., a computing device such as controller 2000). Current flowing from the second generator N-G bond can be represented as +ve as it enters the line current sensor 130 through the 'dot' and leaves the line current sensor 130 from the other side.

The system control modules 120 can also determine one or more voltages of the power system 200. More specifically, the system control modules 120 can determine a voltage associated with each phase. As explained above, the voltage associated with the power generators can be measured between a phase and a neutral (e.g. a line to neutral voltage $V_{LN}$). Therefore, the first phase (e.g., phase A) can be associated with $V_{an}$, the second phase (e.g., phase B) can be associated with $V_{bn}$, and the third phase (e.g., phase C) can be associated with $V_{cn}$.

Under these fault conditions, P1 can therefore be represented as +ve, P2 as −ve, I3 as +ve, and I4 as +ve. The controller can be configured to determine that with this example configuration of components, the positive value of P1 along with negative value of P2, and positive values of I3 and I4 indicate the ground fault is on the line bus of the second generator. In one embodiment, under these fault conditions, the system control module 120 closest to the second generator can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 500. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 500. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 500. In some implementations, the controller is configured to transmit an alarm and/or alarm condition. In some implementations, the controller is configured to trip the associated breaker 160 in cases where the ground fault current is above the pickup value of the ground fault current.

Figure 8:
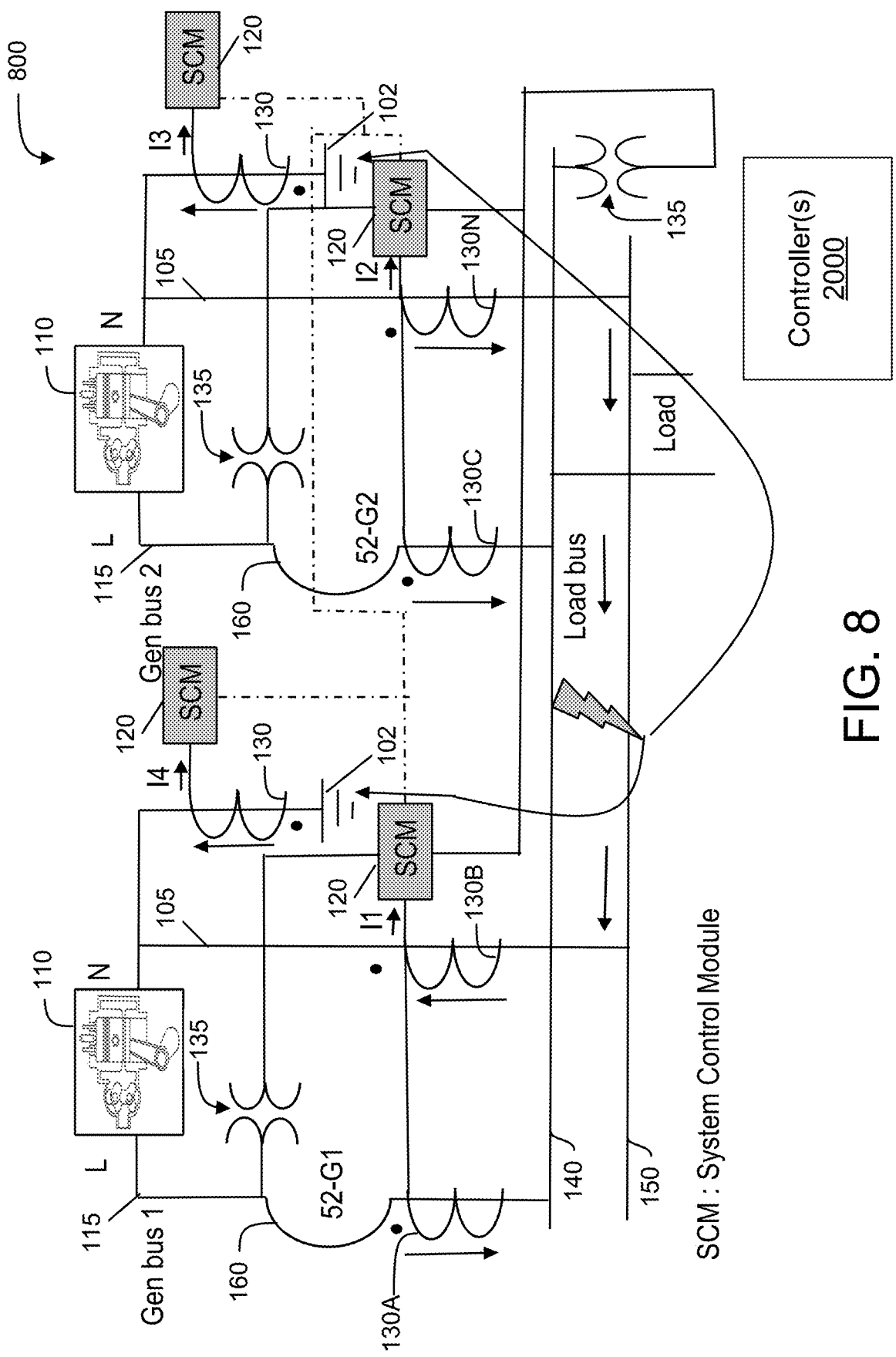
FIG. 8 is a schematic block diagram showing power flow with a ground fault on a load bus on a third phase in the power system of FIG. 5 according to an example implementation.

FIG. 8 is a schematic diagram showing current flow in the power system 500 with an illustrated power fault on the load bus line for the first generator 110 according to an example implementation. The power system 500 may include multiple ground points 102. The power system 500 shows two power generators 110 each with a corresponding generator bus, various line current sensors 130 (e.g., current transducers), various potential transformers 135, system control modules 120 communicatively coupled to one or more of the line current sensors 130, potential transformers 135, circuit breakers 160, a load bus 140, and a neutral bus 150. Each bus can represent one or more phases of power (e.g. three phase power). In an example implementation, power system 500 shows current sensors 130 installed between the neutral/ground bonds of each generator and on the buses from the load and neutral of each generator to the respective load bus 140 and neutral bus 150. There is a 'dot' placed on the current sensors 130 which indicate that when current flows through the 'dot' into the current sensor 130, the current is considered positive and when current enters the current sensor 130 from the other side and leaves the current sensor 130 through the 'dot' the current is considered negative as the direction of the current is reversed. The voltage term 'V' used can be the average or rms voltage of the bus voltage and the line side voltage of the power generators 110. In case any of the voltage is zero then it can be ignored from the calculation.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 500. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the common bus embodiment shown in FIG. 8 and are contemplated. It is also noted that the use of system control modules for detecting the location and phase of one or more faults in the power system 500 via the coupled current sensors 130 and the potential transformers 135. The system control modules 120 enables the use of power equipment from differing manufacturers, allowing the control to be independent of the system components.

FIG. 8 shows an example implementation with a power fault (short to ground) on the load bus 140 compromising normal current flow. The current flow in these conditions can be analyzed in a controller (e.g., a controller 2000). In some implementations, currents are analyzed with I1 representing the current flow through the line current sensors 130 on the line and neutral buses of the first generator with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current flows into the line side line current sensor 130 through the 'dot' and it returns to the first generator through Neutral to Ground bond bypassing the neutral current sensor 130 of the first generator bus, 52-G1. Therefore, the vector sum of currents through the current sensors 130 of 52-G1 will be positive. Since the power fault is causing current to flow from the first generator (G1) to load bus 140 back to the first generator (G1), this can be represented as +ve.

Currents can be further analyzed with I2 representing the current flow through the line current sensors 130 on the line and neutral buses of the second generator with I2 being the vector sum of the currents shown. The system control modules 120 communicatively coupled to these respective line current sensors 130 can be configured to communicate the current flow information to one or more other system control modules 120 and/or a controller (e.g., a computing device such as controller 200).

The controller can be configured to calculate the power flow through the line current sensors 130 on the line and neutral buses of the second generator as P2=$V_{ab}$*I2. The current flows into the line side line current sensors 130 through the 'dot' and it returns to the second generator through Neutral to Ground bond bypassing the neutral current sensor 130 of 52-G2. Therefore, the vector sum of currents through the current sensors 130 of 52-G2 will be positive. Current flowing from the second generator to a load bus 140 can be represented as +ve.

Currents can be further analyzed with I3 representing the current flow through the line current sensor 130 on the bus connecting neutral to ground for the second generator. The system control module 120 communicatively coupled to this respective line current sensor 130 can be configured to communicate the current flow information to one or more other system control module 120 and/or a controller (e.g., a computing device such as controller 2000). Current flowing from the second generator N-G bond can be represented as +ve as it enters the line current sensor 130 through the 'dot' and leaves the CT from the other side.

Currents can be further analyzed with I4 representing the current flow through the line current sensor 130 on the bus connecting neutral to ground for the first generator. The system control module 120 communicatively coupled to this respective line current sensor 130 can be configured to communicate the current flow information to one or more other system control modules 120 and/or a controller (e.g., a computing device such as controller 2000). Current flowing from the second generator N-G bond can be represented as +ve as it enters the line current sensor 130 through the 'dot' and leaves the line current sensor 130 from the other side.

The system control modules 120 can also determine one or more voltages of the power system 200. More specifically, the system control modules 120 can determine a voltage associated with each phase. As explained above, the voltage associated with the power generators can be measured between a phase and a neutral (e.g. a line to neutral voltage $V_{LN}$). Therefore, the first phase (e.g., phase A) can be associated with $V_{an}$, the second phase (e.g., phase B) can be associated with $V_{bn}$, and the third phase (e.g., phase C) can be associated with $V_{cn}$.

Under these fault conditions, P1 can therefore be represented as +ve, P2 as +ve, I3 as +ve, and I4 as +ve. The controller can be configured to determine that with this example configuration of components, the positive value of P1, P2, I3 and I4 indicate the ground fault is on the load bus of the two generators. In one embodiment, under these fault conditions, the system control module 120 closest to the load bus 140 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{bc}$, and $V_{ca}$ being equal to $V_{LN}$, and $V_{bc}$ being equal to $V_{LL}$ indicates a fault on the first phase (e.g., phase A) of the power system 500. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 500. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 500. In some implementations, the controller is configured to transmit an alarm and/or alarm condition. In some implementations, the controller is configured to trip the associated breaker 160 in cases where the ground fault current is above the pickup value of the ground fault current.

Various scenarios as illustrated in FIGS. 5-8 for power flow are summarized in the following table:

|  | Normal Voltages and Current | Fault on Load Bus, Phase A | Fault on Generator 1, Phase B | Fault on Generator 2, Phase C |
|---|---|---|---|---|
| $V_{an}$ | $V_{LN}$ | 0 | $V_{LN}$ | $V_{LN}$ |
| $V_{bn}$ | $V_{LN}$ | $V_{LN}$ | 0 | $V_{LN}$ |
| $V_{cn}$ | $V_{LN}$ | $V_{LN}$ | $V_{LN}$ | 0 |
| $V_{ab}$ | $V_{LL}$ | $V_{LN}$ | $V_{LN}$ | $V_{LL}$ |
| $V_{bc}$ | $V_{LL}$ | $V_{LL}$ | $V_{LN}$ | $V_{LN}$ |
| $V_{ca}$ | $V_{LL}$ | $V_{LN}$ | $V_{LL}$ | $V_{LN}$ |
| P1 | +ve | +ve | −ve | +ve |
| P2 | −ve | +ve | +ve | −ve |
| I3 + I4 | 0 | +ve | +ve | +ve |

Figure 9:
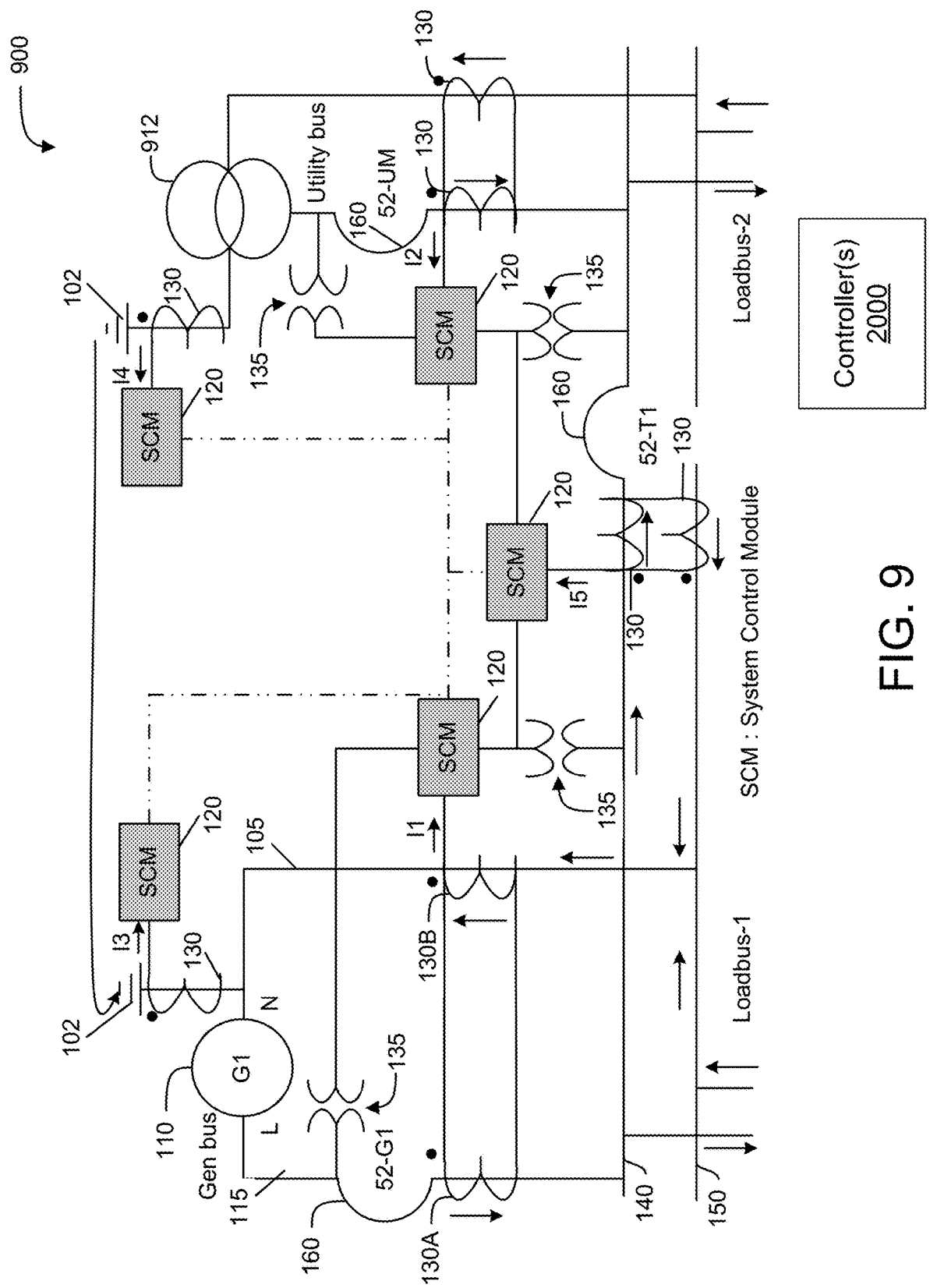
FIG. 9 is a schematic block diagram showing normal power flow in a transfer pair with a Tie breaker and multiple point ground in a power system according to an example implementation.

FIG. 9 is a schematic diagram showing normal power flow in a transfer pair with a Tie breaker and multiple point ground in a power system 900 with generator and utility according to an example implementation. In some embodiments, such as the embodiment illustrated in FIG. 9, the power system 900 may comprise a transfer pair with a tie in a multiple point ground system. In some embodiments, the power system 100 may include a single ground point. The power system 900 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 900 shows current sensors 130 installed between the neutral/ground bonds of the generator 110 and on the buses from the load and neutral of the generator 110 to the respective load bus 140 and neutral bus 150. Additionally, power system 900 shows current sensors 130 installed between the neutral/ground bonds of the generator 110 and on the buses from the load and neutral of the utility 912 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 900. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 9 and are contemplated. It is also noted that the use of system control modules for detecting the location and phase of one or more faults in the power system 900 via the coupled current sensors 130 and the potential transformers 135. The system control modules 120 enables the use of power equipment from differing manufacturers, allowing the control to be independent of the system components.

FIG. 9 shows an example implementation with normal current flow. Normal current flow can be analyzed in a controller (e.g., a controller 2000). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 9, I1 is positive and can be represented as +ve.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus as $P2=V_{ab}*I2$. I2 can be represented as −ve. Current flowing from the utility bus 912 to a load bus 140 can be represented as −ve.

Currents can be further analyzed with I3 representing the current flow through the line current sensor 130 on the bus connecting neutral to ground (N-G) for the generator (G1). The system control module 120 communicatively coupled to this respective line current sensor 130 can be configured to communicate the current flow information to one or more other system control modules 120 and/or a controller (e.g., a computing device such as controller 2000). Return current flow from the load to the neutral bus 150, to the N-G bond of G1 is considered +ve because current flowing from ground towards neutral is considered positive.

Currents can be further analyzed with I4 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive.

Currents can be further analyzed with I5 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. The controller can be configured to calculate the power flow through the line current sensors 130 on the neutral to neutral of the tie breaker 52-T1 as $P5=V_{ab}*I5$. I5 can be represented as −ve.

Under normal conditions when P1 is positive, P2 is negative, I3+I4 is zero, P5 is positive, and $V_{LL}=\sqrt{3}*V_{LN}$ for all three power phases there is no power fault in the system.

Figure 10:
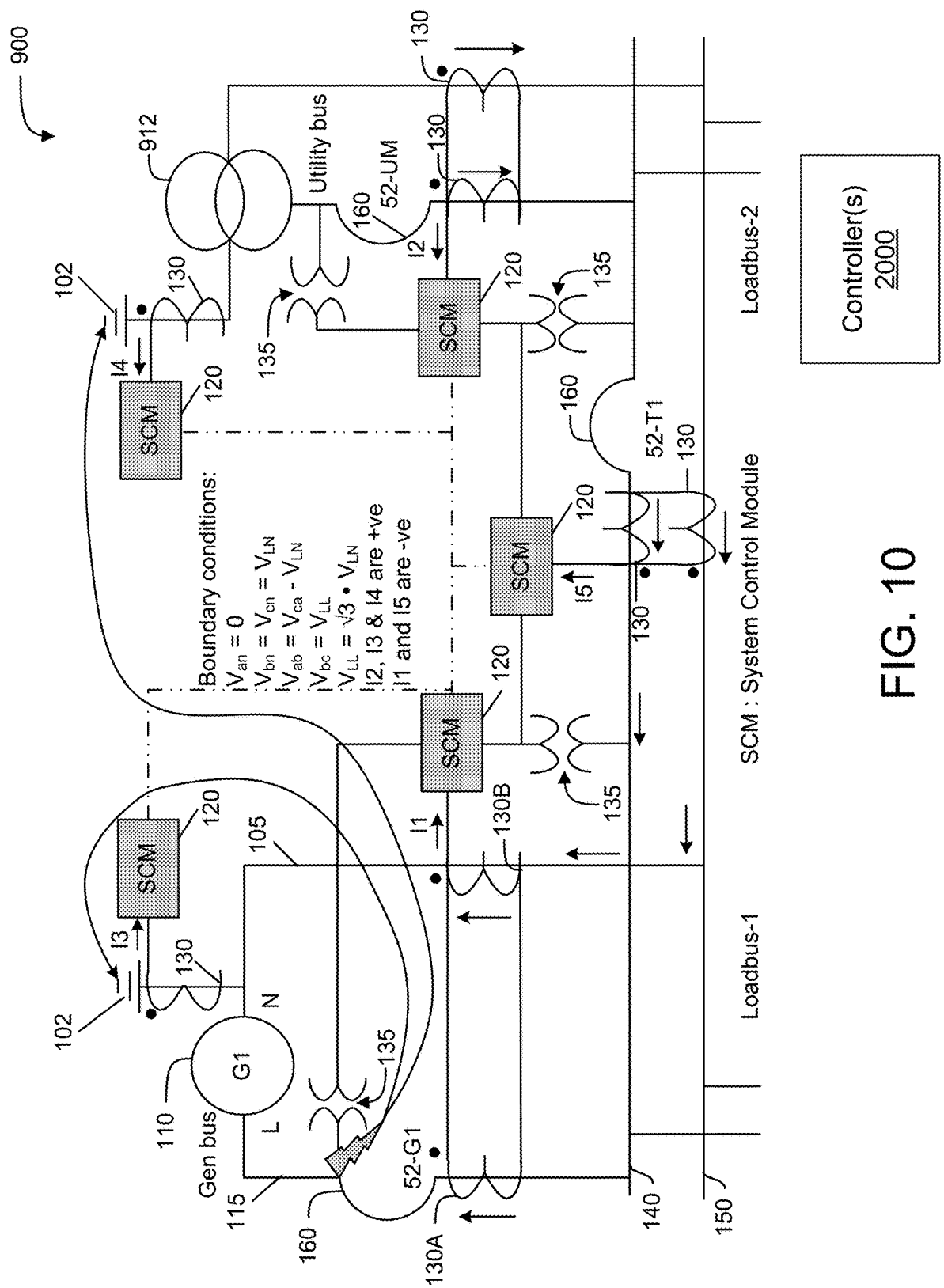
FIG. 10 is a schematic block diagram showing power flow with a ground fault on a generator bus on a first phase in the power system of FIG. 9 according to an example implementation.

FIG. 10 is a schematic diagram showing normal power flow in a transfer pair with a Tie breaker and multiple point ground in the power system 900 with an illustrated power fault on the load line for the generator 110 according to an example implementation. Power system 900 may comprise a transfer pair with a tie in a multiple point ground system. The power system 900 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 900 shows current sensors 130 installed between the neutral/ground bonds of the generator 110 and on the buses from the load and neutral of the generator 110 to the respective load bus 140 and neutral bus 150. Additionally, power system 900 shows current sensors 130 installed between the neutral/ground bonds of the generator 110 and on the buses from the load and neutral of the utility 912 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 900. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 10 and are contemplated. It is also noted that the use of system control modules for detecting the location and phase of one or more faults in the power system 900 via the coupled current sensors 130 and the potential transformers 135. The system control modules 120 enables the use of power equipment from differing manufacturers, allowing the control to be independent of the system components.

FIG. 10 shows an example implementation with a power fault (short to ground) on the first generator load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 10, I1 is negative and can be represented as −ve.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus 912 as $P2=V_{ab}*$. In the exemplary implementation shown in FIG. 10, I2 is positive and can be represented as +ve.

Currents can be further analyzed with I3 representing the current flow through the line current sensor 130 on the bus connecting neutral to ground (N-G) for the generator (G1). The system control module 120 communicatively coupled to this respective line current sensor 130 can be configured to communicate the current flow information to one or more other system control modules 120 and/or a controller (e.g., a computing device such as controller 2000). Return current flow from the load to the neutral bus 150, to the N-G bond of G1 is considered +ve because current flowing from ground towards neutral is considered positive. Therefore, in the exemplary implementation shown in FIG. 10, I3 is positive and can be represented as +ve.

Currents can be further analyzed with I4 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 10, I4 is positive and can be represented as +ve.

Currents can be further analyzed with I5 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. The controller can be configured to calculate the power flow through the line current sensors 130 on the neutral to neutral of the tie breaker 52-T1 as $P5=V_{ab}*I5$. In the exemplary implementation shown in FIG. 10, I5 is negative and can be represented as −ve.

Under these fault conditions, P1 and P5 can therefore be represented as −ve, P2 as +ve, I3 as +ve, and I4 as +ve. The controller can be configured to determine that with this example configuration of components, the negative value of P1 and P5 along with positive values of P2, I3 and I4 indicate the ground fault is on the line bus of the generator (G1). In one embodiment, under these fault conditions, the system control module 120 closest to G1 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 900. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 900. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 900. In some implementations, the controller is configured to transmit an alarm and/or alarm condition. In some implementations, the controller is configured to trip the associated breaker 160 in cases where the ground fault current is above the pickup value of the ground fault current.

Figure 11:
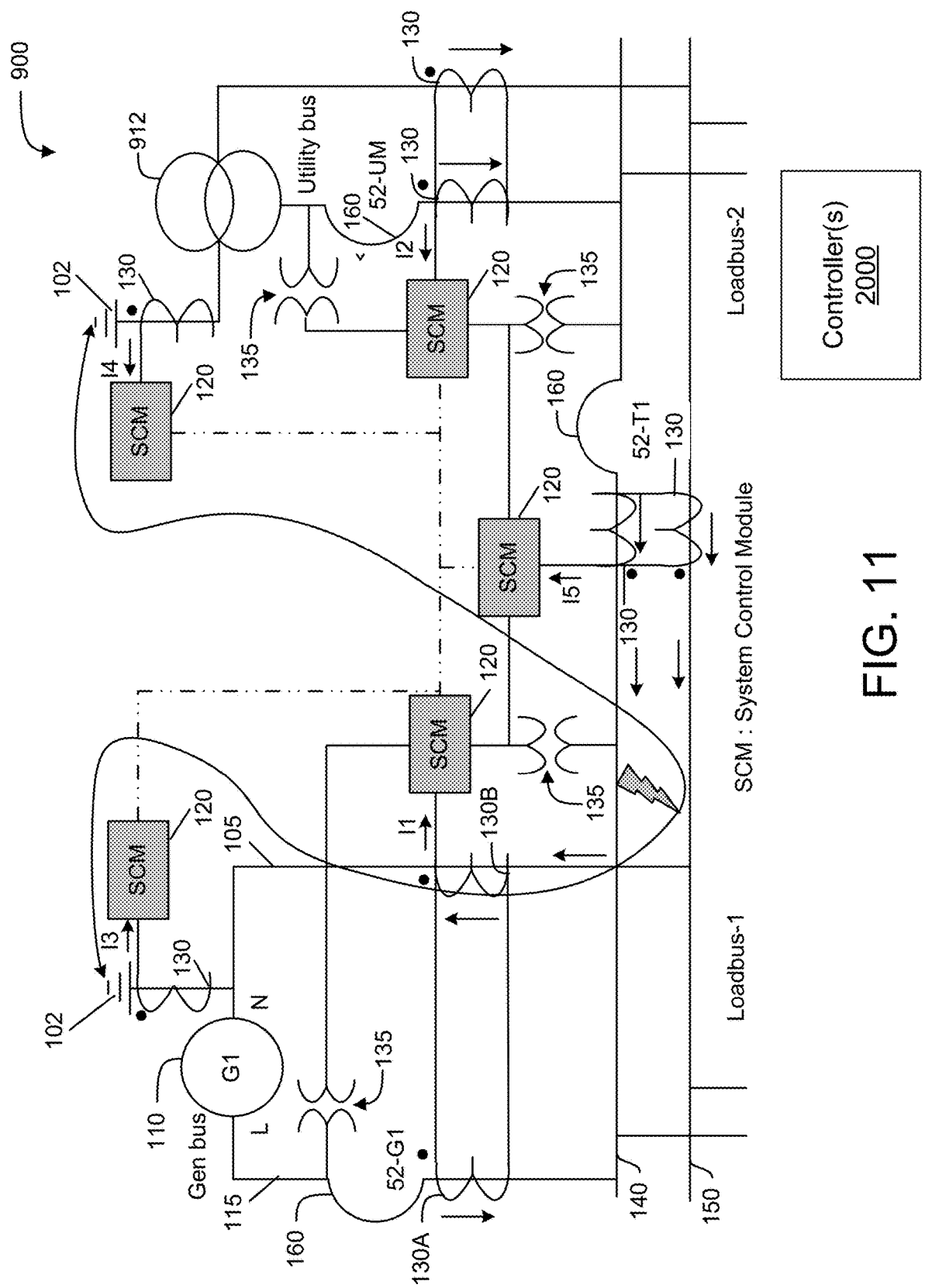
FIG. 11 is a schematic block diagram showing power flow with a ground fault on a first load bus on a third phase in the power system of FIG. 9 according to an example implementation.

FIG. 11 is a schematic diagram showing normal power flow in a transfer pair with a Tie breaker and multiple point ground in a power system 1100 with an illustrated power fault on a first load or load bus (Loadbus-1) for the utility 912 and the generator according to an example implementation. Power system 1100 may comprise a transfer pair with a tie in a multiple point ground system. The power system 1100 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 1100 shows current sensors 130 installed between the neutral/ground bonds of the generator 110 and on the buses from the load and neutral of the generator 110 to the respective load bus 140 and neutral bus 150. Additionally, power system 1100 shows current sensors 130 installed between the neutral/ground bonds of the generator 110 and on the buses from the load and neutral of the utility 110 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 1100. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 11 and are contemplated. It is also noted that the use of system control modules for detecting the location and phase of one or more faults in the power system 1100 via the coupled current sensors 130 and the potential transformers 135. The system control modules 120 enables the use of power equipment from differing manufacturers, allowing the control to be independent of the system components.

FIG. 11 shows an example implementation with power fault on the first load or load bus (Loadbus-1) for the utility 912 and the generator (G1) compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 11, I1 is positive and can be represented as +ve.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus 912 as P2=$V_{ab}$*I2. In the exemplary implementation shown in FIG. 11, I2 is positive and can be represented as +ve.

Currents can be further analyzed with I3 representing the current flow through the line current sensor 130 on the bus connecting neutral to ground (N-G) for the generator (G1). The system control module 120 communicatively coupled to this respective line current sensor 130 can be configured to communicate the current flow information to one or more other system control modules 120 and/or a controller (e.g., a computing device such as controller 2000). Return current flow from the load to the neutral bus 150, to the N-G bond of G1 is considered +ve because current flowing from ground towards neutral is considered positive. Therefore, in the exemplary implementation shown in FIG. 11, I3 is positive and can be represented as +ve.

Currents can be further analyzed with I4 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 11, 14 is positive and can be represented as +ve.

Currents can be further analyzed with I5 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. The controller can be configured to calculate the power flow through the line current sensors 130 on the neutral to neutral of the tie breaker 52-T1 as P5=$V_{ab}$*I5. In the exemplary implementation shown in FIG. 11, I5 is negative and can be represented as −ve.

Under these fault conditions, P5 can therefore be represented as −ve, P1 and P2 as +ve, 13 as +ve, and I4 as +ve. The controller can be configured to determine that with this example configuration of components, the negative value of P5 along with positive values of P1, P2, I3 and 14 indicate the ground fault is on the first load or load bus (Loadbus-1). In one embodiment, under these fault conditions, the system control module 120 closest to Loadbus-1 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 1100. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 1100. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 1100. In some implementations, the controller is configured to transmit an alarm and/or alarm condition. In some implementations, the controller is configured to trip the associated breaker 160 in cases where the ground fault current is above the pickup value of the ground fault current.

Figure 12:
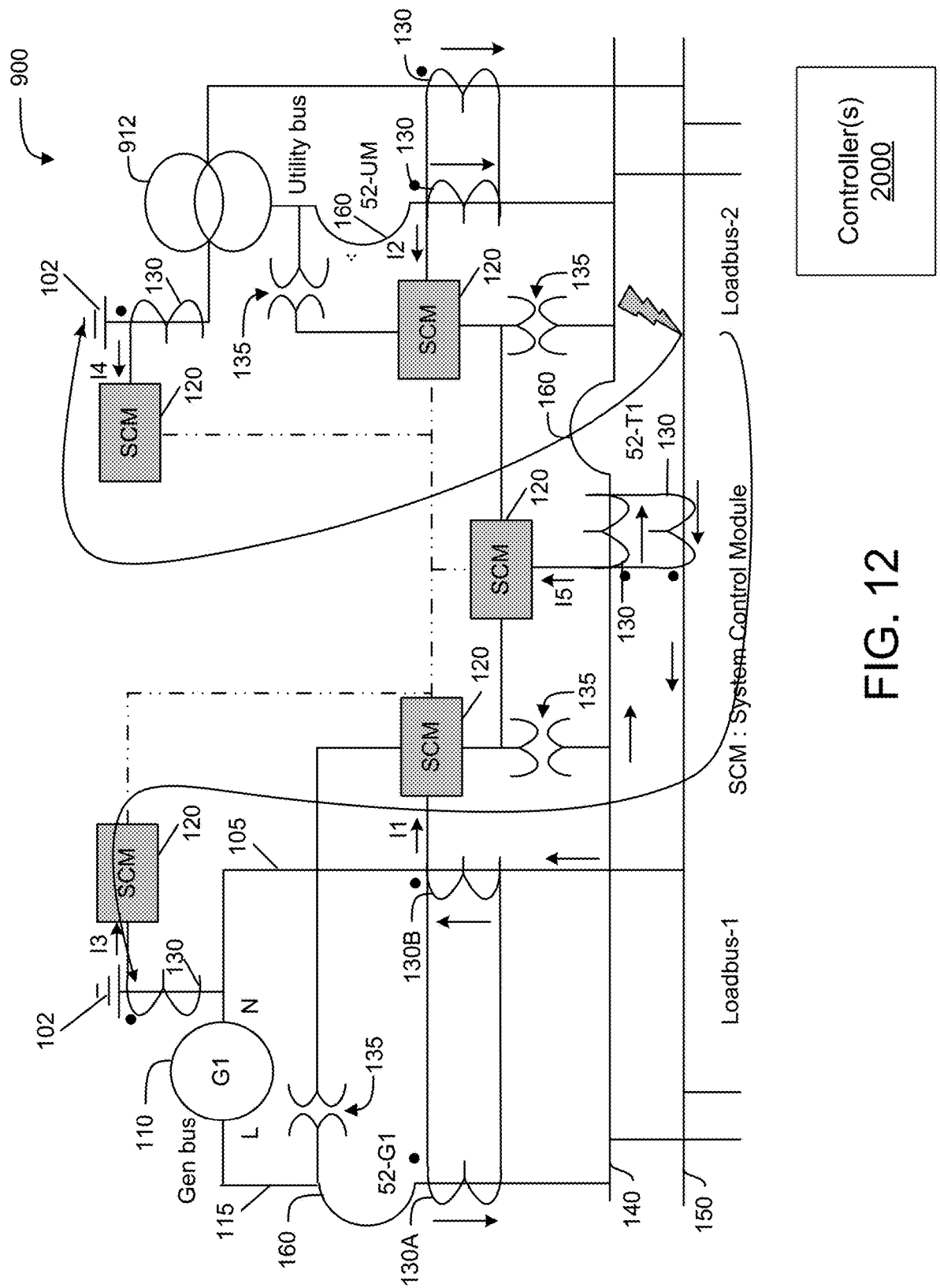
FIG. 12 is a schematic block diagram showing power flow with a ground fault on a second load bus on a third phase in the power system of FIG. 9 according to an example implementation.

FIG. 12 is a schematic diagram showing normal power flow in a transfer pair with a Tie breaker and multiple point ground in the power system 900 with an illustrated power fault on a second load or load bus (Loadbus-2) for the utility 912 and the generator according to an example implementation. Power system 900 may comprise a transfer pair with a tie in a multiple point ground system. The power system 900 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 900 shows current sensors 130 installed between the neutral/ground bonds of the generator 110 and on the buses from the load and neutral of the generator 110 to the respective load bus 140 and neutral bus 150. Additionally, power system 900 shows current sensors 130 installed between the neutral/ground bonds of the generator 110 and on the buses from the load and neutral of the utility 110 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 900. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 12 and are contemplated. It is also noted that the use of system control modules for detecting the location and phase of one or more faults in the power system 900 via the coupled current sensors 130 and the potential transformers 135. The system control modules 120 enables the use of power equipment from differing manufacturers, allowing the control to be independent of the system components.

FIG. 12 shows an example implementation with power fault on the second load or load bus (Loadbus-2) for the utility 912 and the generator (G1) compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 12, I1 is positive and can be represented as +ve.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus 912 as P2=$V_{ab}$*I2. In the exemplary implementation shown in FIG. 12, I2 is positive and can be represented as +ve.

Currents can be further analyzed with I3 representing the current flow through the line current sensor 130 on the bus connecting neutral to ground (N-G) for the generator (G1). The system control module 120 communicatively coupled to this respective line current sensor 130 can be configured to communicate the current flow information to one or more other system control modules 120 and/or a controller (e.g., a computing device such as controller 2000). Return current flow from the load to the neutral bus 150, to the N-G bond of G1 is considered +ve because current flowing from ground towards neutral is considered positive. Therefore, in the exemplary implementation shown in FIG. 12, I3 is positive and can be represented as +ve.

Currents can be further analyzed with I4 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 12, I4 is positive and can be represented as +ve.

Currents can be further analyzed with I5 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. The controller can be configured to calculate the power flow through the line current sensors 130 on the neutral to neutral of the tie breaker 52-T1 as P5=$V_{ab}$*I5. In the exemplary implementation shown in FIG. 12, I5 is positive and can be represented as +ve.

Under these fault conditions, P1, P2, and P5 can therefore be represented as +ve and I3 and I4 can be represented as +ve. The controller can be configured to determine that with this example configuration of components, the positive value of P1, P2, P5, I3, and I4 indicate the ground fault is on the second load or load bus (Loadbus-2). In one embodiment, under these fault conditions, the system control module 120 closest to Loadbus-2 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 900. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 900. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 900. In some implementations, the controller is configured to transmit an alarm and/or alarm condition. In some implementations, the controller is configured to trip the associated breaker 160 in cases where the ground fault current is above the pickup value of the ground fault current.

Figure 13:
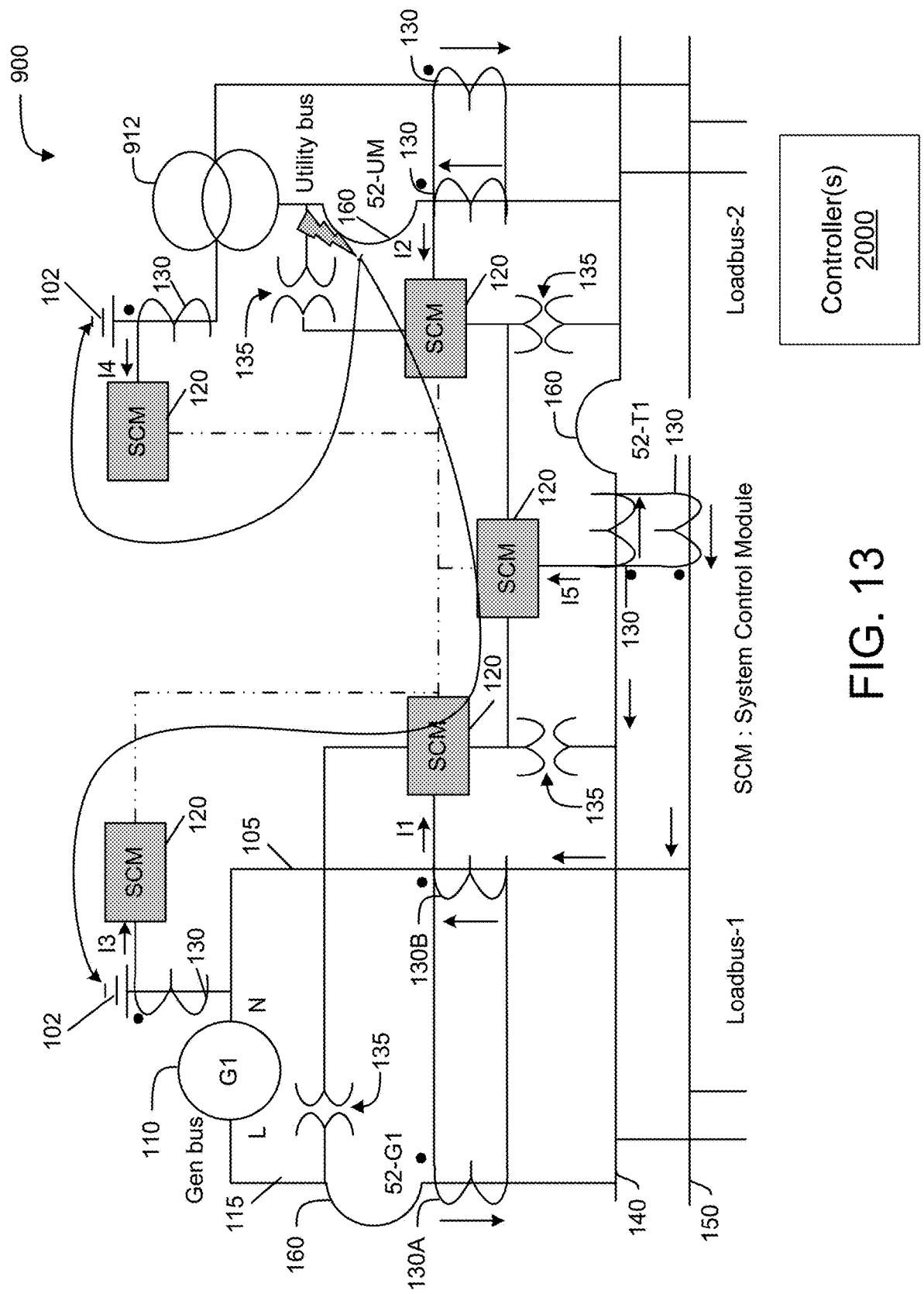
FIG. 13 is a schematic block diagram showing power flow with a ground fault on a utility bus on a second phase in the power system of FIG. 9 according to an example implementation.

FIG. 13 is a schematic diagram showing normal power flow in a transfer pair with a Tie breaker and multiple point ground in the power system 900 with an illustrated power fault on the utility 912 load bus according to an example implementation. Power system 900 may comprise a transfer pair with a tie in a multiple point ground system. The power system 900 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 900 shows current sensors 130 installed between the neutral/ground bonds of the generator 110 and on the buses from the load and neutral of the generator 110 to the respective load bus 140 and neutral bus 150. Additionally, power system 900 shows current sensors 130 installed between the neutral/ground bonds of the generator 110 and on the buses from the load and neutral of the utility 110 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 900. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 13 and are contemplated. It is also noted that the use of system control modules for detecting the location and phase of one or more faults in the power system 900 via the coupled current sensors 130 and the potential transformers 135. The system control modules 120 enables the use of power equipment from differing manufacturers, allowing the control to be independent of the system components.

FIG. 13 shows an example implementation with power fault on the utility 912 load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 13, I1 is positive and can be represented as +ve.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus 912 as $P2=V_{ab}*I2$. In the exemplary implementation shown in FIG. 13, I2 is negative and can be represented as −ve.

Currents can be further analyzed with I3 representing the current flow through the line current sensor 130 on the bus connecting neutral to ground (N-G) for the generator (G1). The system control module 120 communicatively coupled to this respective line current sensor 130 can be configured to communicate the current flow information to one or more other system control modules 120 and/or a controller (e.g., a computing device such as controller 2000). Return current flow from the load to the neutral bus 150, to the N-G bond of G1 is considered +ve because current flowing from ground towards neutral is considered positive. Therefore, in the exemplary implementation shown in FIG. 13, I3 is positive and can be represented as +ve.

Currents can be further analyzed with I4 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 13, I4 is positive and can be represented as +ve.

Currents can be further analyzed with I5 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. The controller can be configured to calculate the power flow through the line current sensors 130 on the neutral to neutral of the tie breaker 52-T1 as P5=$V_{ab}$*I5. In the exemplary implementation shown in FIG. 13, I5 is positive and can be represented as +ve.

Under these fault conditions, P1, and P5 can therefore be represented as +ve, P2 can be therefore represented as −ve, and I3 and I4 can be represented as +ve. The controller can be configured to determine that with this example configuration of components, the positive value of P1, P5, I3, and I4 and the negative value of P2 indicate the ground fault is on the utility 912 bus. In one embodiment, under these fault conditions, the system control module 120 closest to utility 912 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 900. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 900. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 900. In some implementations, the controller is configured to transmit an alarm and/or alarm condition. In some implementations, the controller is configured to trip the associated breaker 160 in cases where the ground fault current is above the pickup value of the ground fault current.

Various scenarios as illustrated in FIGS. 9-13 for power flow are summarized in the following table:

| | Normal Voltages and Current | Fault on Generator 1, Phase A | Fault on Utility Bus, Phase B | Fault on Loadbus-1, Phase C | Fault on Loadbus-2, Phase C |
|---|---|---|---|---|---|
| $V_{an}$ | $V_{LN}$ | 0 | $V_{LN}$ | $V_{LN}$ | $V_{LN}$ |
| $V_{bn}$ | $V_{LN}$ | $V_{LN}$ | 0 | $V_{LN}$ | $V_{LN}$ |
| $V_{cn}$ | $V_{LN}$ | $V_{LN}$ | $V_{LN}$ | 0 | 0 |
| $V_{ab}$ | $V_{LL}$ | $V_{LN}$ | $V_{LN}$ | $V_{LL}$ | $V_{LL}$ |
| $V_{bc}$ | $V_{LL}$ | $V_{LL}$ | $V_{LN}$ | $V_{LN}$ | $V_{LN}$ |
| $V_{ca}$ | $V_{LL}$ | $V_{LN}$ | $V_{LL}$ | $V_{LN}$ | $V_{LN}$ |
| P1 | +ve | −ve | +ve | +ve | +ve |
| P2 | −ve | +ve | −ve | +ve | +ve |
| P5 | +ve | −ve | +ve | −ve | +ve |
| I3 + I4 | 0 | +ve | +ve | +ve | +ve |

Figure 14:
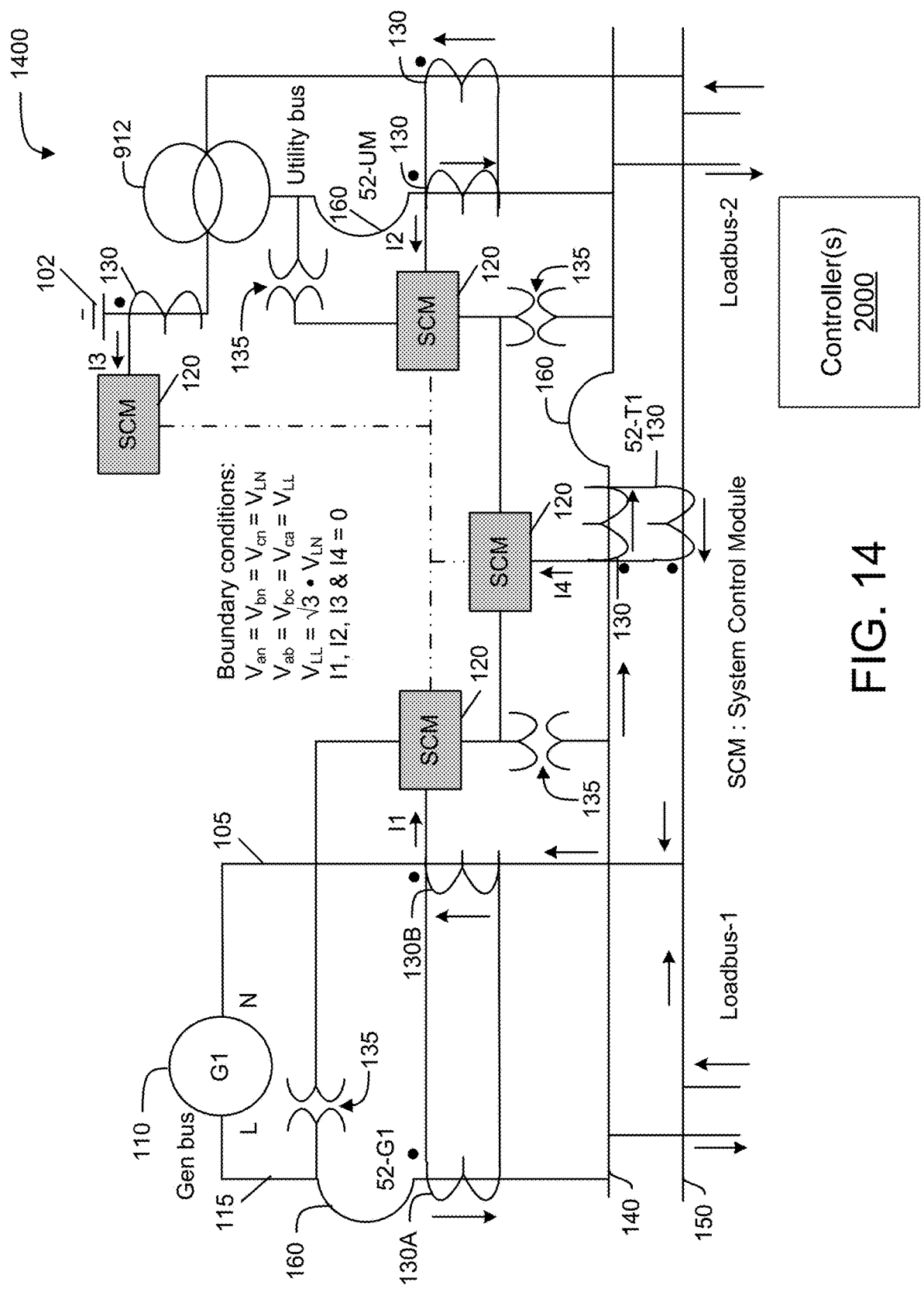
FIG. 14 is a schematic block diagram showing normal power flow in a transfer pair with a Tie breaker and a single point of ground in a power system according to an example implementation.

FIG. 14 is a schematic diagram showing normal power flow in a transfer pair with a Tie breaker and multiple point ground in a power system 1400 with generator and utility according to an example implementation. In some embodiments, such as the embodiment illustrated in FIG. 14, the power system 1400 may comprise a transfer pair with a tie in a single point ground system. In some embodiments, the power system 1400 may include multiple ground points. The power system 1400 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 1400 shows current sensors 130 installed between the neutral/ground bonds of the generator 110 and on the buses from the load and neutral of the generator 110 to the respective load bus 140 and neutral bus 150. Additionally, power system 1400 shows current sensors 130 installed between the neutral/ground bonds of the generator 110 and on the buses from the load and neutral of the utility 912 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 1400. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 14 and are contemplated. It is also noted that the use of system control modules for detecting the location and phase of one or more faults in the power system 1400 via the coupled current sensors 130 and the potential transformers 135. The system control modules 120 enables the use of power equipment from differing manufacturers, allowing the control to be independent of the system components.

FIG. 14 shows an example implementation with normal current flow. Normal current flow can be analyzed in a controller (e.g., a controller 2000). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 14, I1 is zero.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus 912 as P2=$V_{ab}$*I2. Current flowing from the utility bus 912 to a load bus 140 can be represented as I2. In the exemplary implementation shown in FIG. 14, I2 is zero.

Currents can be further analyzed with I3 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. In the exemplary implementation shown in FIG. 14, I3 is zero. The controller can be configured to calculate the power flow through the line current sensors 130 on the N-G bond for the utility 912 as P3=$V_{ab}$*I3.

Currents can be further analyzed with I4 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. The controller can be configured to calculate the power flow through the line current sensors 130 on the neutral to neutral of the tie breaker 52-T1 as P4=$V_{ab}$*I4. In the exemplary implementation shown in FIG. 14, I4 is zero.

Under normal conditions when P1, P2, and P4 are zero, I3 is zero, and $V_{LL}=\sqrt{3}*V_{LN}$ for all three power phases there is no power fault in the system.

Figure 15:
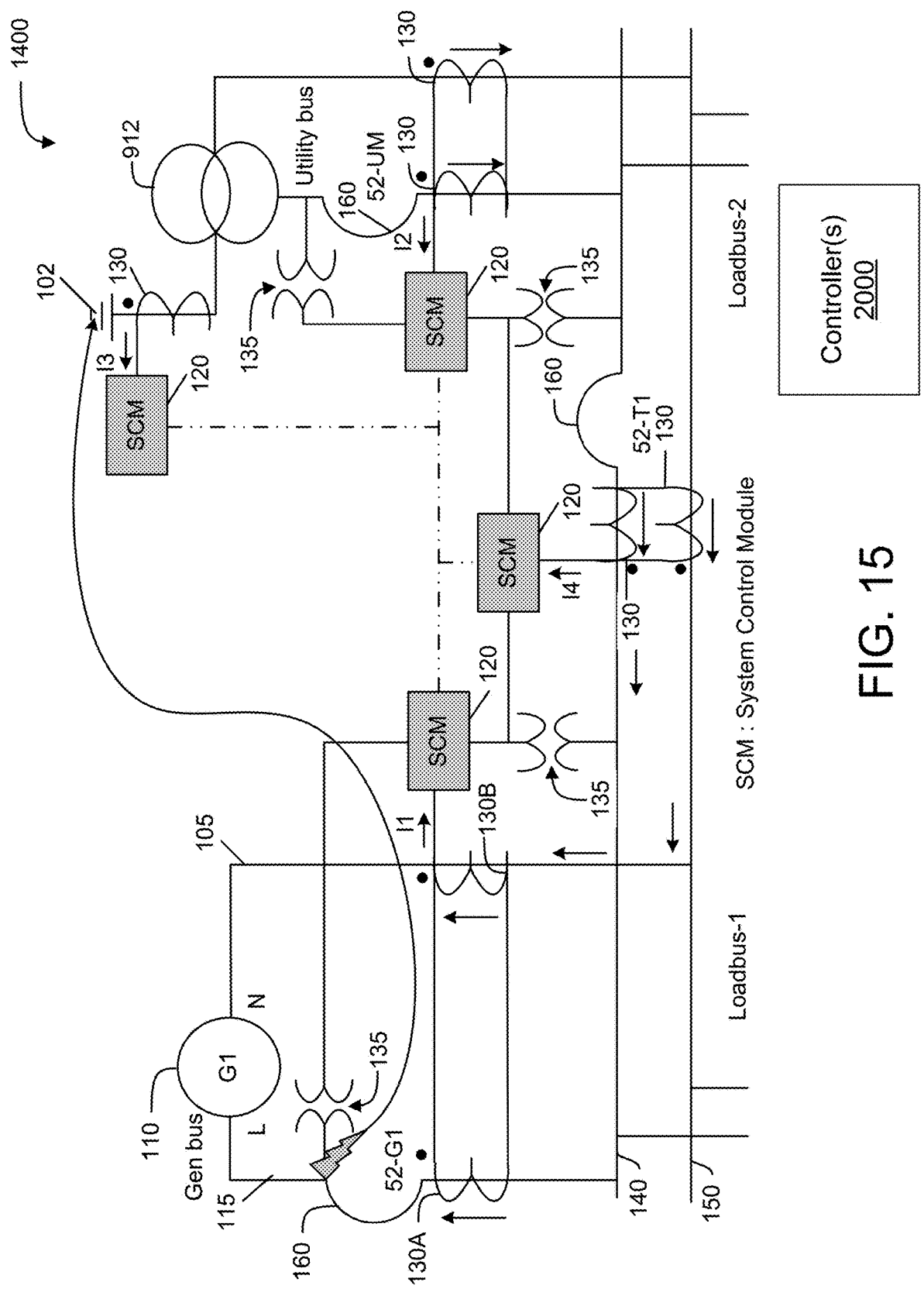
FIG. 15 is a schematic block diagram showing power flow with a ground fault on a first generator bus on a first phase in the power system of FIG. 14 according to an example implementation.

FIG. 15 is a schematic diagram showing normal power flow in a transfer pair with a Tie breaker and a single point ground in the power system 1400 with an illustrated power fault on the load line for the generator 110 according to an example implementation. Power system 1400 may comprise a transfer pair with a tie in a single point ground system. The power system 1400 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 1400 shows current sensors 130 installed between the neutral/ground bonds of the generator 110 and on the buses from the load and neutral of the generator 110 to the respective load bus 140 and neutral bus 150. Additionally, power system 1400 shows current sensors 130 installed between the neutral/ground bonds of the generator 110 and on the buses from the load and neutral of the utility 912 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 1400. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 15 and are contemplated. It is also noted that the use of system control modules for detecting the location and phase of one or more faults in the power system 1400 via the coupled current sensors 130 and the potential transformers 135. The system control modules 120 enables the use of power equipment from differing manufacturers, allowing the control to be independent of the system components.

FIG. 15 shows an example implementation with a power fault (short to ground) on the first generator load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 15, I1 is negative and can be represented as −ve.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus 912 as P2=$V_{ab}$*I2. In the exemplary implementation shown in FIG. 15, I2 is positive and can be represented as +ve.

Currents can be further analyzed with I3 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 15, I3 is positive and can be represented as +ve.

Currents can be further analyzed with I4 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. Therefore, in the exemplary implementation shown in FIG. 15, I4 is negative and can be represented as −ve. The controller can be configured to calculate the power flow through the line current sensors 130 on the neutral to neutral of the tie breaker 52-T1 as $P4=V_{ab}*I4$.

Under these fault conditions, P1 and P4 are negative can therefore be represented as −ve, P2 is positive and can be represented as +ve, I3 is positive and can be represented as +ve. The controller can be configured to determine that with this example configuration of components, the negative value of P1 and P4 along with positive values of P2 and I3 indicate the ground fault is on the line bus of the generator (G1). In one embodiment, under these fault conditions, the system control module 120 closest to G1 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 1400. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 1400. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 1400. In some implementations, the controller is configured to transmit an alarm and/or alarm condition. In some implementations, the controller is configured to trip the associated breaker 160 in cases where the ground fault current is above the pickup value of the ground fault current.

Figure 16:
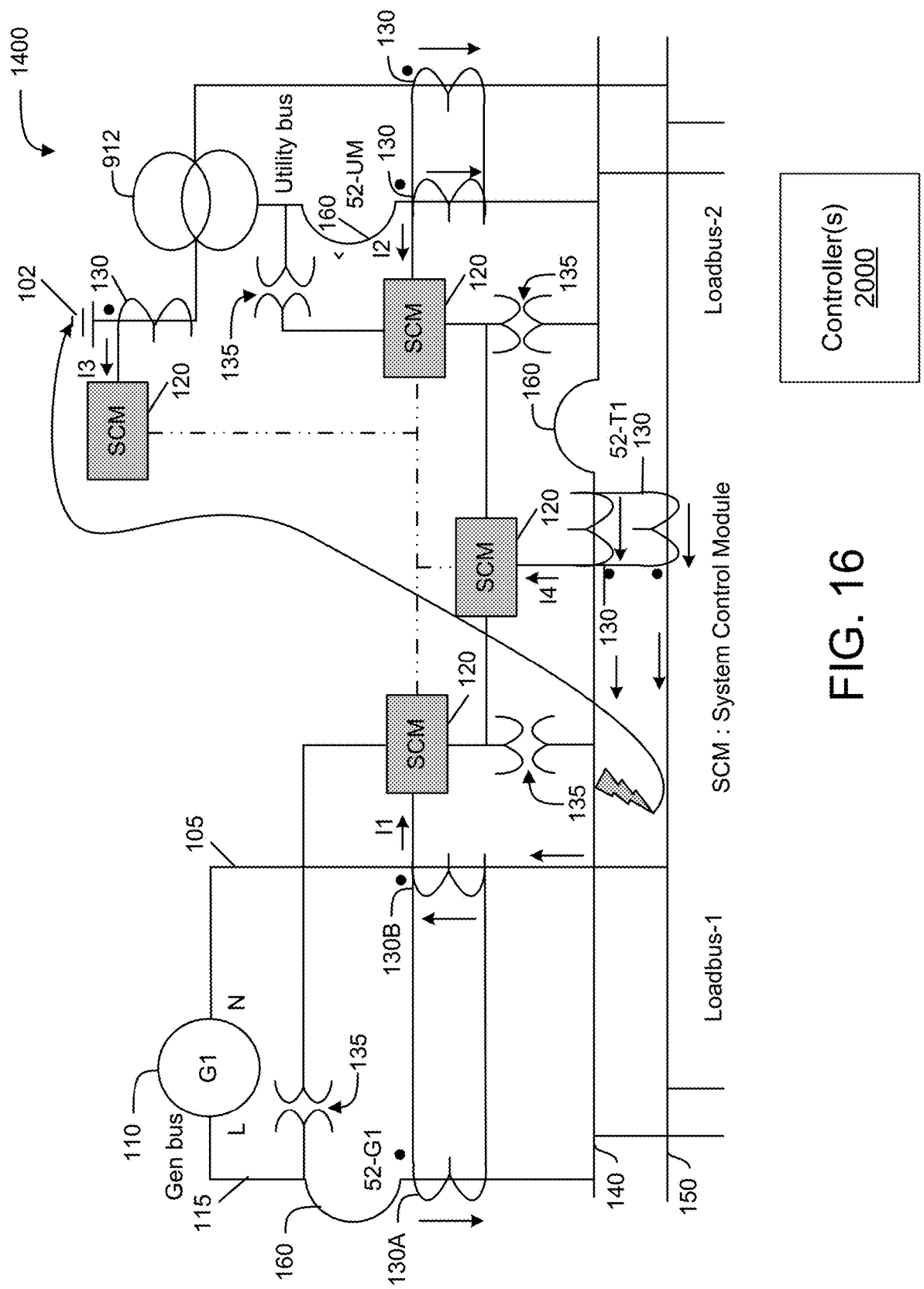
FIG. 16 is a schematic block diagram showing power flow with a ground fault on a first load bus on a third phase in the power system of FIG. 14 according to an example implementation.

FIG. 16 is a schematic diagram showing normal power flow in a transfer pair with a Tie breaker and a single point ground in the power system 1400 with an illustrated power fault on a first load or load bus (Loadbus-1) for the utility 912 and the generator according to an example implementation. Power system 1400 may comprise a transfer pair with a tie in a single point ground system. The power system 1400 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 1400 shows current sensors 130 installed between the neutral/ground bonds of the generator 110 and on the buses from the load and neutral of the generator 110 to the respective load bus 140 and neutral bus 150. Additionally, power system 1100 shows current sensors 130 installed between the neutral/ground bonds of the generator 110 and on the buses from the load and neutral of the utility 110 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 1400. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 11 and are contemplated. It is also noted that the use of system control modules for detecting the location and phase of one or more faults in the power system 1100 via the coupled current sensors 130 and the potential transformers 135. The system control modules 120 enables the use of power equipment from differing manufacturers, allowing the control to be independent of the system components.

FIG. 16 shows an example implementation with power fault on the first load or load bus (Loadbus-1) for the utility 912 and the generator (G1) compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as $P1=V_{ab}*I1$. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 16, I1 is zero.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus as P2=$V_{ab}$*I2. In the exemplary implementation shown in FIG. 16, I2 is positive and can be represented as +ve.

Currents can be further analyzed with I3 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 16, I3 is positive and can be represented as +ve.

Currents can be further analyzed with I4 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. Therefore, in the exemplary implementation shown in FIG. 16, I4 is negative and can be represented as −ve. The controller can be configured to calculate the power flow through the line current sensors 130 on the neutral to neutral of the tie breaker 52-T1 as P4=$V_{ab}$*I4.

Under these fault conditions, P4 is negative and can therefore be represented as −ve, P1 is zero, and P2 is positive and can be represented as +ve, I3 is positive and can be represented as +ve. The controller can be configured to determine that with this example configuration of components, the negative value of P4, along with positive values of P2 and I3 indicate the ground fault is on the first load or load bus (Loadbus-1). In one embodiment, under these fault conditions, the system control module 120 closest to Loadbus-1 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 1400. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 1400. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 1400. In some implementations, the controller is configured to transmit an alarm and/or alarm condition. In some implementations, the controller is configured to trip the associated breaker 160 in cases where the ground fault current is above the pickup value of the ground fault current.

Figure 17:
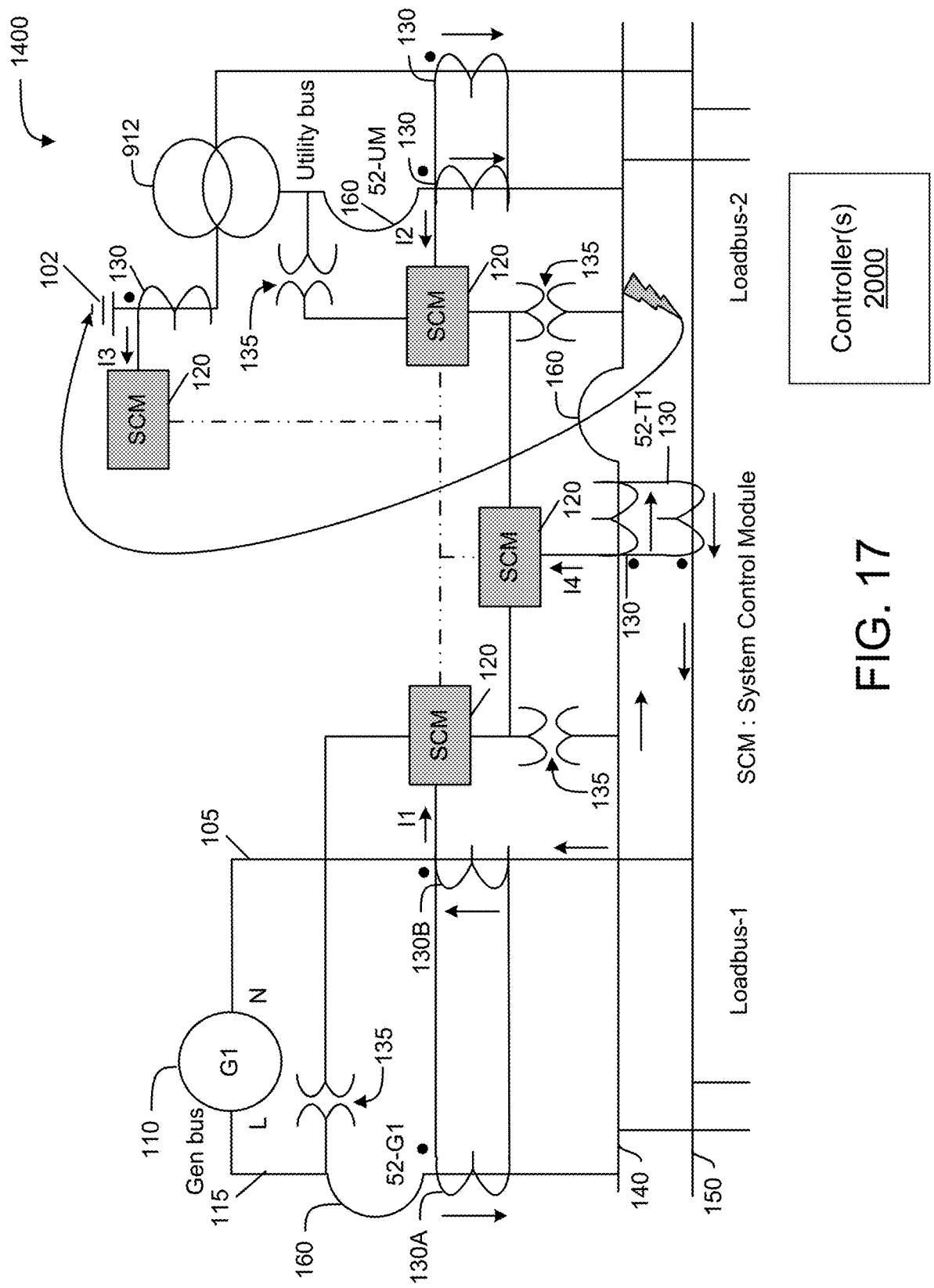
FIG. 17 is a schematic block diagram showing power flow with a ground fault on a second load bus on a third phase in the power system of FIG. 14 according to an example implementation.

FIG. 17 is a schematic diagram showing normal power flow in a transfer pair with a Tie breaker and a single point ground in the power system 1400 with an illustrated power fault on a second load or load bus (Loadbus-2) for the utility 912 and the generator according to an example implementation. Power system 1400 may comprise a transfer pair with a tie in a multiple point ground system. The power system 1400 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 1400 shows current sensors 130 installed between the neutral/ground bonds of the generator 110 and on the buses from the load and neutral of the generator 110 to the respective load bus 140 and neutral bus 150. Additionally, power system 1400 shows current sensors 130 installed between the neutral/ground bonds of the generator 110 and on the buses from the load and neutral of the utility 110 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 900. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 17 and are contemplated. It is also noted that the use of system control modules for detecting the location and phase of one or more faults in the power system 1400 via the coupled current sensors 130 and the potential transformers 135. The system control modules 120 enables the use of power equipment from differing manufacturers, allowing the control to be independent of the system components.

FIG. 17 shows an example implementation with power fault on the second load or load bus (Loadbus-2) for the utility 912 and the generator (G1) compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 17, I1 is zero.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the utility bus as P2=$V_{ab}$*I2. In the exemplary implementation shown in FIG. 17, I2 is positive and can be represented as +ve.

Currents can be further analyzed with I3 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 17, I3 is positive and can be represented as +ve.

Currents can be further analyzed with I4 representing the current flow through the line current sensor 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. Therefore, in the exemplary implementation shown in FIG. 17, I4 is zero. The controller can be configured to calculate the power flow through the line current sensors 130 on the neutral to neutral of the tie breaker 52-T1 as P4=$V_{ab}$*I4.

Under these fault conditions, P1 and P4 are zero, P2 and I3 are positive and can be represented as +ve. The controller can be configured to determine that with this example configuration of components, the positive value of P2 and I3 along with the zero values of P1 and P4 indicate the ground fault is on the second load or load bus (Loadbus-2). In one embodiment, under these fault conditions, the system control module 120 closest to Loadbus-2 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 1400. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 1400. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 1400. In some implementations, the controller is configured to transmit an alarm and/or alarm condition. In some implementations, the controller is configured to trip the associated breaker 160 in cases where the ground fault current is above the pickup value of the ground fault current.

Figure 18:
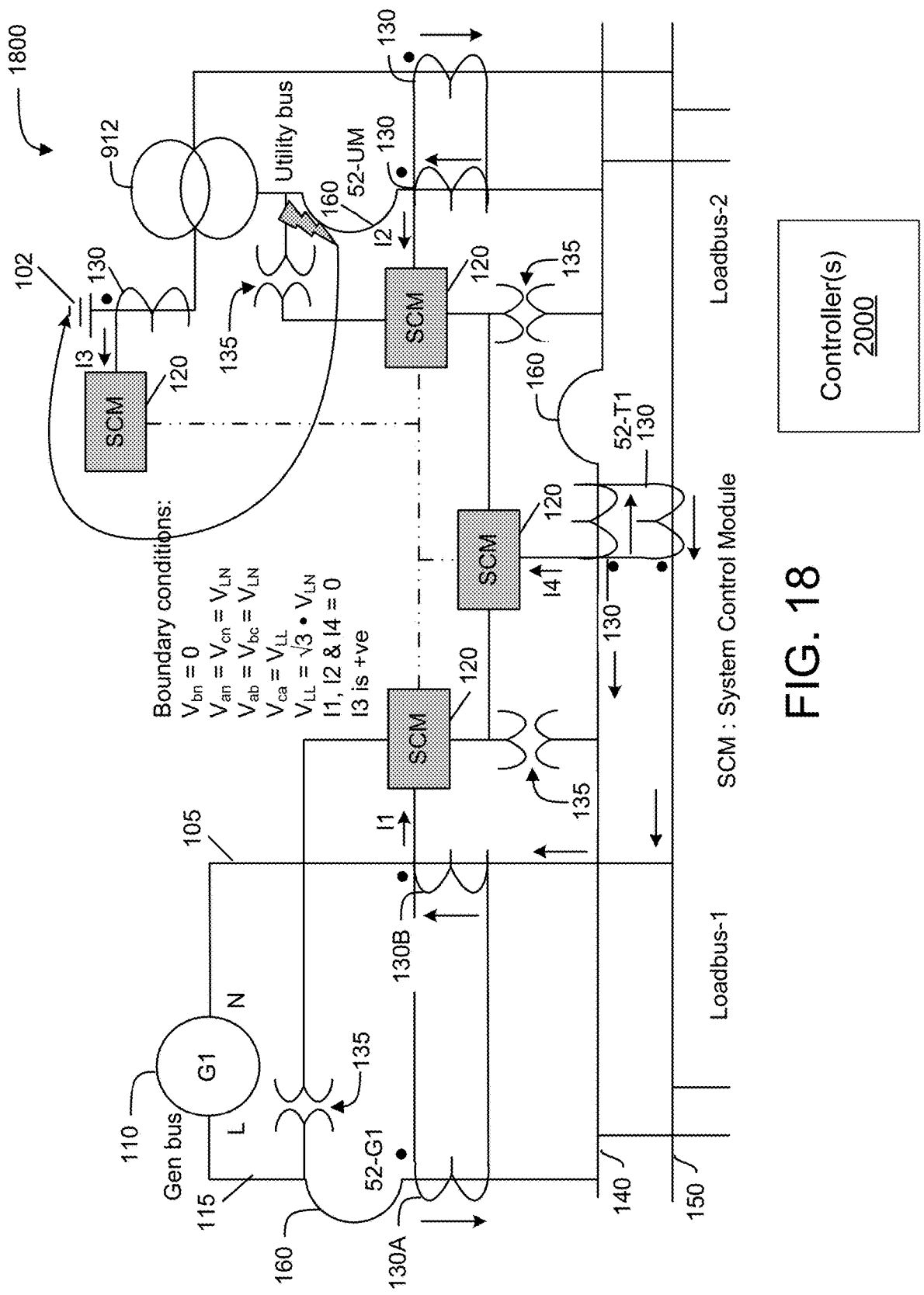
FIG. 18 is a schematic block diagram showing power flow with a ground fault on a utility bus on a second phase in the power system of FIG. 14 according to an example implementation.

FIG. 18 is a schematic diagram showing normal power flow in a transfer pair with a Tie breaker and a single point ground in a power system 1400 with an illustrated power fault on the utility 912 load bus according to an example implementation. Power system 1400 may comprise a transfer pair with a tie in a multiple point ground system. The power system 1400 shows a power generator 110 and a utility 912 each with a respective generator bus and utility bus, various line current sensors 130, system control modules 120 communicatively coupled to one or more of the line current sensors 130, potential transformers 135, circuit breakers 160, and load buses 140, and a neutral bus 150. Each bus can represent one or more phases of power (e.g. three phase power). In an example implementation, power system 1400 shows current sensors 130 installed between the neutral/ground bonds of the generator 110 and on the buses from the load and neutral of the generator 110 to the respective load bus 140 and neutral bus 150. Additionally, power system 1400 shows current sensors 130 installed between the neutral/ground bonds of the generator 110 and on the buses from the load and neutral of the utility 110 to the respective load bus 140 and neutral bus 150.

In some implementations, a voltage associated with the power generators can be measured between two lines (e.g., a line-to-line voltage $V_{LL}$). For example, the line-to-line voltages can include a $V_{ab}$, $V_{bc}$, and $V_{ca}$ for the power system 1400. In some implementations, a voltage associated with the power generators can be measured between a phase and a neutral (e.g. a line to neutral voltage $V_{LN}$). For example, the phase-to-neutral voltages can include $V_{an}$, $V_{bn}$, and $V_{cn}$. It is noted that additional generators can be added to the main transfer pair with a Tie breaker embodiment shown in FIG. 18 and are contemplated. It is also noted that the use of system control modules for detecting the location and phase of one or more faults in the power system 1400 via the coupled current sensors 130 and the potential transformers 135. The system control modules 120 enables the use of power equipment from differing manufacturers, allowing the control to be independent of the system components.

FIG. 18 shows an example implementation with power fault on the utility 912 load bus compromising normal current flow. The current flow in these conditions can be analyzed in a controller (e.g., a controller 2000 as shown in FIG. 20). In some implementations, currents are analyzed with I1 representing the current flow through the line current sensors 130 on the line and neutral buses of the generator 110 with I1 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the first generator as P1=$V_{ab}$*I1. The current is entering the line current sensors 130 through the 'dot' (using dot convention transformer notation, where +ve indicate the direction of the current or power flow and relative magnitude from the in-phase induced voltages with regards to the dot notation of the current sensor 130, i.e., into the dot, and −ve indicates a negative current or power flow and relative magnitude) and all current does not return through the neutral current sensor 130 with opposite polarity. In the exemplary implementation shown in FIG. 18, I1 is zero.

Currents can be further analyzed with I2 representing the current flow through the line current sensors 130 on the utility bus 912 with I2 being the vector sum of the currents shown. The system control modules 120 communicatively coupled to these respective line current sensors 130 can be configured to communicate the current flow information to one or more other system control modules 120 and/or a controller (e.g., a computing device such as controller 2000).

The controller can be configured to calculate the power flow through the line current sensors 130 on the line and neutral buses of the utility bus as $P2=V_{ab}*I2$. In the exemplary implementation shown in FIG. 18, I2 is zero.

Currents can be further analyzed with I3 representing the current flow through the line current sensor 130 on the bus connecting neutral to ground (N-G bond) for the utility 912. The system control module 120 communicatively coupled to this respective line current sensor 130 can be configured to communicate the current flow information to one or more other system control modules 120 and/or a controller (e.g., a computing device such as controller 2000). Return Current flowing from the neutral bus 150 to the N-G bond of the utility 912, is considered +ve because current flowing from ground towards neutral is considered positive. Therefore, in the exemplary implementation shown in FIG. 18, I3 is positive and can be represented as +ve.

Currents can be further analyzed with I4 representing the current flow through the line current sensors 130 on the bus connecting neutral to the neutral of the tie breaker 52-T1. The system control module 120 communicatively coupled to this respective line current sensor 130 can be configured to communicate the current flow information to one or more other system control modules 120 and/or a controller (e.g., a computing device such as controller 2000). Current flowing from generator side of the power system towards the utility is considered positive (+ve) because it enters 52-T1 through the 'dot'. Therefore, in the exemplary implementation shown in FIG. 18, I4 is zero. The controller can be configured to calculate the power flow through the line current sensors 130 on the neutral to neutral of the tie breaker 52-T1 as $P4=V_{ab}*I4*\cos\emptyset 4$, wherein $\emptyset 4$ is the angle between the respective bus voltage '$V_{ab}$' and I4.

Under these fault conditions, P1, P2, and P4 are zero and I3 is positive and can be therefore represented +ve. The controller can be configured to determine that with this example configuration of components, the zero value of P1, P2, and P4 and the positive value of I3 indicate the ground fault is on the utility 912 bus. In one embodiment, under these fault conditions, the system control module 120 closest to utility 912 can determine that $V_{an}$ is zero, $V_{bn}$, $V_{cn}$, $V_{ab}$, and $V_{ca}$ are equal to $V_{LN}$, and $V_{bc}$ is equal to $V_{LL}$. The controller can be configured to determine that with this example configuration of components, $V_{an}$ being equal to zero, $V_{bn}$, $V_{cn}$, $V_{ab}$, and $V_{ca}$ being equal to $V_{LN}$, and $V_{bc}$ being equal to $V_{LL}$ indicates a fault on the first phase (e.g., phase A) of the power system 1400. In another embodiment, under these fault conditions, $V_{bn}$ is zero, $V_{an}$, $V_{cn}$, $V_{ab}$ and $V_{bc}$ are equal to $V_{LN}$, and $V_{ca}$ is equal to $V_{LL}$. The controller can be configured to determine that with this example configuration of components, $V_{bn}$ being equal to zero, $V_{an}$, $V_{cn}$, $V_{ab}$ and $V_{bc}$ being equal to $V_{LN}$, and $V_{ca}$ being equal to $V_{LL}$ indicates a fault on the second phase (e.g., phase B) of the power system 1400. In another embodiment, under these fault conditions, $V_{cn}$ is zero, $V_{an}$, $V_{bn}$, $V_{ca}$ and $V_{bc}$ are equal to $V_{LN}$, and $V_{ab}$ is equal to $V_{LL}$. The controller can be configured to determine that with this example configuration of components, $V_{cn}$ being equal to zero, $V_{an}$, $V_{bn}$, $V_{ca}$ and $V_{bc}$ being equal to $V_{LN}$, and $V_{ab}$ being equal to $V_{LL}$ indicates a fault on the third phase (e.g., phase C) of the power system 1400. In some implementations, the controller is configured to transmit an alarm and/or alarm condition. In some implementations, the controller is configured to trip the associated breaker 160 in cases where the ground fault current is above the pickup value of the ground fault current.

Various scenarios as illustrated in FIGS. 14-18 for power flow are summarized in the following table:

|  | Normal Voltages and Current | Fault on Generator 1, Phase A | Fault on Utility Bus, Phase B | Fault on Loadbus-1, Phase C | Fault on Loadbus-2, Phase C |
|---|---|---|---|---|---|
| $V_{an}$ | $V_{LN}$ | 0 | $V_{LN}$ | $V_{LN}$ | $V_{LN}$ |
| $V_{bn}$ | $V_{LN}$ | $V_{LN}$ | 0 | $V_{LN}$ | $V_{LN}$ |
| $V_{cn}$ | $V_{LN}$ | $V_{LN}$ | $V_{LN}$ | 0 | 0 |
| $V_{ab}$ | $V_{LL}$ | $V_{LN}$ | $V_{LN}$ | $V_{LL}$ | $V_{LL}$ |
| $V_{bc}$ | $V_{LL}$ | $V_{LL}$ | $V_{LN}$ | $V_{LN}$ | $V_{LN}$ |
| $V_{ca}$ | $V_{LL}$ | $V_{LN}$ | $V_{LL}$ | $V_{LN}$ | $V_{LN}$ |
| P1 | 0 | −ve | 0 | 0 | 0 |
| P2 | 0 | +ve | 0 | +ve | +ve |
| P4 | 0 | −ve | 0 | −ve | 0 |
| I3 | 0 | +ve | +ve | +ve | +ve |

Figure 19:
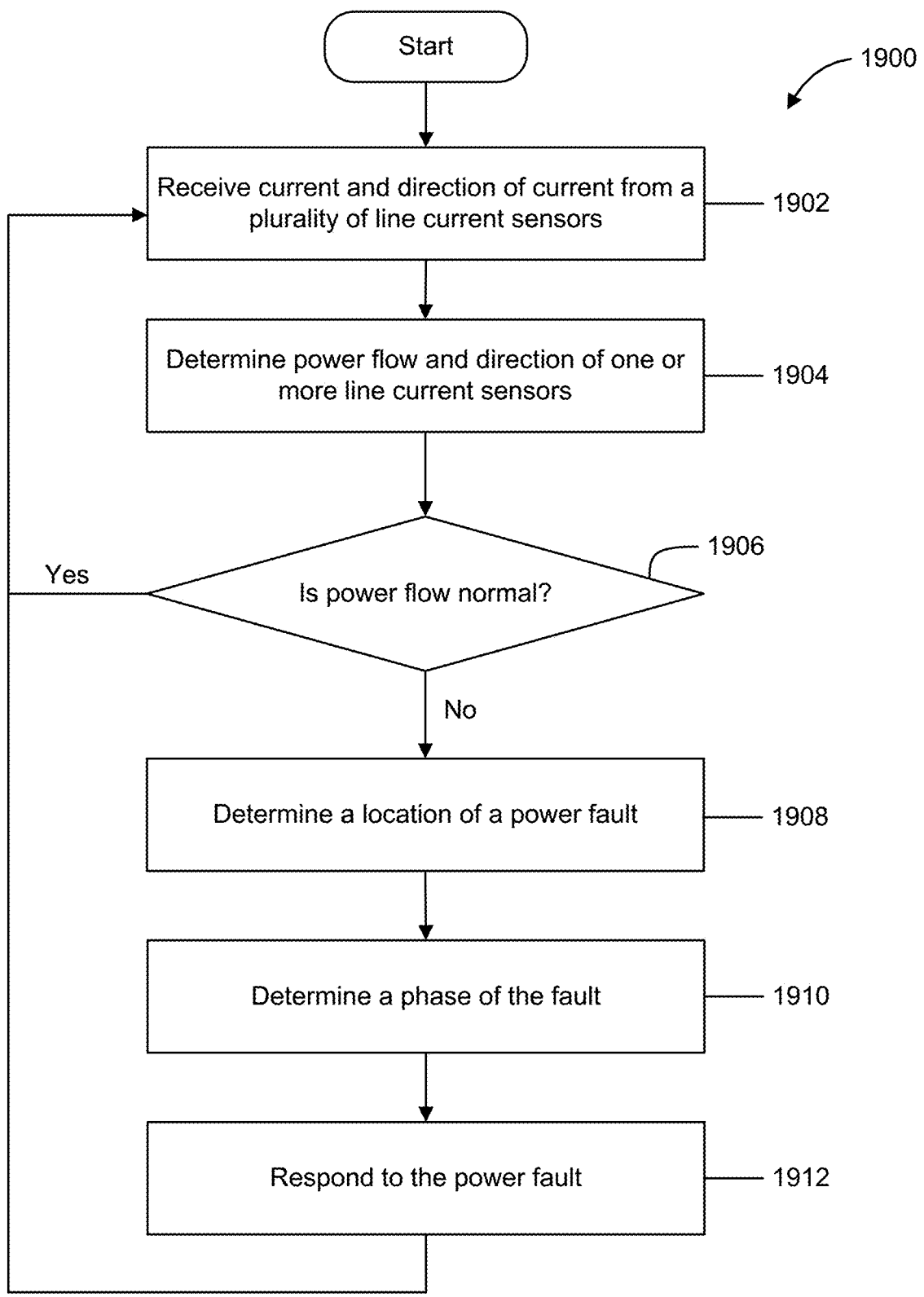
FIG. 19 is a schematic flow diagram of a method of determining a phase and location of a power fault in a power system according to an example implementation.

FIG. 19 illustrates a method 1900 of determining a location of a power fault in a power system according to an example implementation. The operations of method 1900 presented below are intended to be illustrative. In some implementations, method 1900 can be accomplished with one or more additional operations not described, and/or without one or more of the operations discussed. Additionally, the order in which the operations of method 1900 are illustrated in FIG. 19 and described below is not intended to be limiting.

In some implementations, method 1900 can be implemented in one or more processing devices (e.g., a digital processor, an analog processor, a digital circuit designed to process information, an analog circuit designed to process information, a state machine, and/or other mechanisms for electronically processing information). The one or more processing devices can include one or more devices executing some or all of the operations of method 1900 in response to instructions stored electronically on an electronic storage medium. The one or more processing devices can include one or more devices configured through hardware, firmware, and/or software to be specifically designed for execution of one or more of the operations of method 1900. For example, the one or more processing devices can include a controller 2000 as illustrated in FIG. 20.

An operation 1902 can include receiving current and/or direction of current from a plurality of line current sensors. In some implementations, values for the current are received over a network device (e.g., a system control module 120). Current values can be received from a plurality of line current sensors (e.g., line current sensors 130). The plurality of line current sensors can be installed on various buses of a power system such as generator line buses, neutral buses, neutral to ground connections, etc. In some implementations, the network devices (e.g., system control modules 120) communicate the current values to one or more other system control modules 120 before being received. In some implementations, the current values measured by the line current sensors 130 are only received from the system control modules 120 when the current values are above a threshold value. In some implementations, the plurality of line current sensors sends a respective value indicative of direction of current flow and can additionally send a value of current.

An operation 1904 can include determining power flow and direction of one or more of the plurality of line current sensors (e.g., line current sensors 130). The power flow and direction can be calculated through the line current sensors 130 installed on the respective associated bus. For example, power flow can be calculated as P=V*I*cos Ø, wherein 'V' is the bus voltage of the bus where the line current sensor 130 is installed and I, the zero-sequence current on the respective bus. The plurality of line current sensors can be installed on various buses of a power system such as generator line buses, neutral buses, neutral to ground connections, etc.

An operation 1906 can include determining if current flow is normal. The direction of power flow through a plurality of line current sensors (e.g., line current sensors 130) such as generator line buses, neutral buses, neutral to ground connections, etc. is matched to patterns of power flow direction based on the respective configuration of the power system to determine if the current flow is normal.

An operation 1908 can include determining location of power fault. The direction of power flow through a plurality of line current sensors (e.g., line current sensors 130) such as generator line buses, neutral buses, neutral to ground connections, etc. determined at 1906 can be matched to patterns of power flow direction. The matched patterns of power flow direction for the respective configuration of the power system can determine the location (e.g., which bus) a power fault is located.

An operation 1910 can include determining a phase of the fault. As described above, the phase of the fault can be determined based on one or more voltage measurements for a power system. The voltage measurements can be determined by the controller by analyzing the current flow through the line current sensors. The matched voltage measurements for the respective configuration of the power system can determine the phase (e.g., which phase of power) of the power fault.

An operation 1912 can include responding to a power fault. In some implementations, responding to a power fault comprises activating an alarm based on determining the power fault has occurred. The alarm can include a location of the power fault. In some implementations, an alarm comprises setting an alert flag and/or sending a message over a high-speed network (e.g., using one or more system control modules 120). In some implementations, responding to a power fault comprises tripping a circuit breaker (e.g., circuit breaker 160) installed on a respective bus of the power system, the circuit breaker chosen based on the location of the power fault.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

FIG. 20 is a schematic block diagram of an embodiment of a controller 2000. In some implementations, one or more controllers can be part of a generator set including one or more power generators 110. The controller 2000 includes a processor 2002, a memory 2004 or other computer readable medium, and a transceiver 2012. It should be understood that the controller 2000 shows only some implementations of a control circuitry.

The processor 2002 can include a microprocessor, programmable logic controller (PLC) chip, an ASIC chip, or any other suitable processor. The processor 2002 is in communication with the memory 2004 and configured to execute instructions, algorithms, commands or otherwise programs stored in the memory 2004.

The memory 2004 includes any of the memory and/or storage components discussed herein. For example, memory 2004 can include RAM and/or cache of processor 2002. Memory 2004 can also include one or more storage devices (e.g., hard drives, flash drives, computer readable media, etc.) either local or remote to controller 2000. The memory 2004 is configured to store look up tables, algorithms or instructions.

For example, the memory 2004 includes a current analysis circuitry 2004a, a power flow circuitry 2004b, a power fault location circuitry 2004c, a power fault phase circuitry 2004d. The current analysis circuitry 2004a can be configured to analyze values of current flow in network data via transceiver 2012. Current flow analysis can include analyzing values of current associated with line current sensors 130 between the line and neutral buses of one or more generators 110, between the neutral and ground bonds of one or more generators 110, between the load bus and neutral bus of each respective generator 110 of one or more generators 110 and a respective load bus and/or neutral bus, as well as between other possible buses of the system.

The power flow circuitry 2004b can be configured to calculate the power flow through the line current sensors 130 on a respective line and/or neutral bus of a respective generator 110 as P=V*I. For example, the power flow circuitry 2004b can calculate a first power P1 which is the power flow through the line current sensors 130 on the line and neutral buses of the first generator. P1=$V_{ab}$*I1. The power flow circuitry 2004b can also calculate P2, P4 and P5 as described above.

The power fault location circuitry 2004c can be configured to receive current and direction of current from a plurality of line current sensors. Current values can be received from a plurality of line current sensors (e.g., line current sensors 130) through transceiver 178. The power fault location circuitry 2004c can further be configured to determine power flow and direction of one or more of the plurality of line current sensors (e.g., line current sensors 130).

The power flow and direction can be calculated through the line current sensors 130 installed on the respective associated bus For example, power flow can be calculated as P=V*I 'V' is the bus voltage where the line current sensor 130 is installed and I, the zero sequence current on the respective bus. The plurality of line current sensors can be installed on various buses of a power system such as generator line buses, neutral buses, neutral to ground connections, etc.

The power fault location circuitry 2004c can be configured to determine if current flow is normal. The direction of power flow through a plurality of line current sensors (e.g., line current sensors 130) such as generator line buses, neutral buses, neutral to ground connections, etc. is matched to patterns of power flow direction based on the respective configuration of the power system to determine if the current flow is normal.

The power fault location circuitry 2004c can be configured to determine location of a power fault. The direction of power flow through a plurality of line current sensors (e.g., line current sensors 130) such as generator line buses, neutral buses, neutral to ground connections, can be matched to patterns of power flow direction. The matched patterns of power flow direction for the respective configuration of the power system can determine the location (e.g., which bus) a power fault is located.

The power fault phase circuitry 2004d can be configured to receive current and direction of current from a plurality of line current sensors and receive a voltage measurement for each respective bus within the power system. The power fault phase circuitry 2004d can be configured to determine if current flow is normal. Furthermore, the power fault phase circuitry 2004d can be configured to determine if the voltage measurements for each respective bus is normal. The direction of power flow through a plurality of line current sensors (e.g., line current sensors 130) such as generator line buses, neutral buses, neutral to ground connections, etc. and the voltage measurements for each respective power bus can be matched to patterns of power flow based on the respective configuration of the power system to determine if the current flow and voltage measurements are normal.

The power fault location circuitry 2004c can be configured to respond to a power fault. In some implementations, responding to a power fault comprises activating an alarm based on determining the power fault has occurred. The alarm can include a location of the power fault. In some implementations, an alarm comprises setting an alert flag and/or sending a message over a high-speed network (e.g., using one or more system control modules 120). In some implementations, responding to a power fault comprises tripping a circuit breaker (e.g., circuit breaker 160) installed on a respective bus of the power system, the circuit breaker chosen based on the location of the power fault.

It should be noted that the term "example" as used herein to describe various implementations is intended to indicate that such implementations are possible examples, representations, and/or illustrations of possible implementations (and such term is not intended to connote that such implementations are necessarily extraordinary or superlative examples).

The terms "coupled," and the like as used herein mean the joining of two members directly or indirectly to one another. Such joining can be stationary (e.g., permanent) or moveable (e.g., removable or releasable). Such joining can be achieved with the two members or the two members and any additional intermediate members being integrally formed as a single unitary body with one another or with the two members or the two members and any additional intermediate members being attached to one another.

It is important to note that the construction and arrangement of the various exemplary implementations are illustrative only. Although only a few implementations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Additionally, it should be understood that features from some implementations disclosed herein can be combined with features of other implementations disclosed herein as one of ordinary skill in the art would understand. Other substitutions, modifications, changes and omissions can also be made in the design, operating conditions and arrangement of the various exemplary implementations without departing from the scope of the present invention.

While this specification contains many specific implementation details, these should not be construed as limitations on the scope of any inventions or of what can be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable sub combination. Moreover, although features can be described above as acting in certain combinations and even initially claimed as such, one or more features from a claimed combination can in some cases be excised from the combination, and the claimed combination can be directed to a sub combination or variation of a sub combination.

What is claimed is:

1. A power system for identifying power faults, the power system comprising:
    a plurality of line current sensors each disposed between a load bus and one or more power sources;
    a plurality of system control modules, each operatively coupled to one or more of the plurality of line current sensors; and
    one or more controllers configured to:
        receive, from the plurality of system control modules, a plurality of power flow directions as measured by the plurality of line current sensors;
        receive, from the plurality of system control modules, a plurality of voltage measurements based on measurements of a plurality of potential transformers;
        determine a location of a power fault using the plurality of power flow directions; and
        determine a phase of the power fault using the plurality of voltage measurements.

2. The power system of claim 1, further comprising a respective plurality of line current sensors between a first neutral bus and each of the one or more power sources, wherein the one or more power sources comprise a plurality of power sources.

3. The power system of claim 2, wherein the one or more controllers is further configured to:

receive, from the plurality of system control modules, current values measured by the plurality of line current sensors between the first neutral bus and a respective second neutral bus of each of a plurality of generators of the one or more power sources;

determine the location of the power fault further based on respective directions of power flow at each of the plurality of line current sensors between the first neutral bus and each of the second neutral buses; and determine the phase of the power fault further based on respective directions of power flow at each of the plurality of line current sensors between the first neutral bus and each of the second neutral buses.

4. The power system of claim 2, wherein the one or more controllers is further configured to determine no power fault present in the power system based on the respective directions of power flow at each respective line current sensor.

5. The power system of claim 2, wherein the plurality of line current sensors comprises a first line current sensor and a second line current sensor, and wherein the one or more controllers are further configured to:

receive a first value of current flow from the first line current sensor, the first line current sensor electrically coupled between a first power source of the one or more power sources and the load bus;

receive a second value of current flow from the second line current sensor, the second line current sensor electrically coupled between the first power source and the first neutral bus;

receive a first value of voltage from a first potential transformer; receive a second value of voltage from a second potential transformer;

determine a first direction of power flow in the first line current sensor using the first value of current flow;

determine a second direction of power flow in the second line current sensor using the second value of current flow;

determine, based on the first direction of power flow and the second direction of power flow, a power fault is located on one of:
 a first generator bus coupling the first power source with the load bus; or
 the load bus; and determine, based on the first value of voltage and the second value of voltage, a phase of the power fault is located on one of:
 the first generator bus; or
 the load bus.

6. The power system of claim 5, wherein the one or more controllers are further configured to:

receive a third value of current flow from a third line current sensor, the third line current sensor electrically coupled between a second power source of the one or more power sources, and the load bus;

receive a third value of voltage from a third potential transformer;

determine a third direction of power flow in the third line current sensor using the third value of current flow;

determine, based on the third direction of power flow, the power fault is located on one of:
 the first generator bus; or
 the load bus; and determine, based on the third value of voltage, a phase of the power fault is located on one of:
 the first generator bus; or
 the load bus.

7. The power system of claim 6, wherein the one or more controllers are further configured to determine if the power fault is located on a second generator bus coupling the second power source with the load bus.

8. The power system of claim 5, further comprising a circuit breaker installed on the first generator bus, wherein the one or more controllers are further configured to:
 determine the power fault is located on the first generator bus, and
 trip the circuit breaker installed on the first generator bus.

9. The power system of claim 1, further comprising a single grounding point.

10. The power system of claim 1, further comprising a plurality of grounding points.

11. The power system of claim 3, wherein one of the one or more controllers is a controller integrated into one of the plurality of generators.

12. A method of determining a fault in a power system, executing on a controller, the method comprising:

receiving a first value of current flow from a first line current sensor, the first line current sensor electrically coupled between a first generator bus and a load bus;

receiving a second value of current flow from a second line current sensor, the second line current sensor electrically coupled between a second generator bus and the load bus;

receiving a first value of voltage from a first potential transformer;

receiving a second value of voltage from a second potential transformer;

determining a first direction of power flow in the first line current sensor using the first value of current flow;

determining a second direction of power flow in the second line current sensor using the second value of current flow;

determining, based on the first direction of power flow and the second direction of power flow, a power fault is located on one of:
 the first generator bus or the second generator bus; or
 the load bus; and determining, based on the first value of voltage and the second value of voltage, a phase of the power fault is located on one of:
 the first generator bus or the second generator bus; or
 the load bus.

13. The method of claim 12, further comprising:
 operatively connecting the first generator bus to a first generator; and
 operatively connecting the second generator bus to a second generator.

14. The method of claim 13, further comprising:
 receiving a third value of current flow from a third line current sensor, the third line current sensor electrically coupled on between a second generator bus and the load bus;

receiving a third value of voltage from a third potential transformer;

determining a third direction of power flow in the third line current sensor using the third value indicative of current flow;

determining, based on the third direction of power flow, the power fault is located on one of:
 the first generator bus; or
 the second generator bus; and determining, based on the third value of voltage, a phase of the power fault is located on one of:
 the first generator bus or the second generator bus; or
 the load bus.

15. The method of claim 13, further comprising:
tripping, based on determining the phase of the power fault and the power fault is located on one of the first generator bus of the power system or the second generator bus of the power system, a respective circuit breaker operatively connected to:
the first generator bus; or
the second generator bus.

16. A control system for a power system for identifying phases of power faults comprising one or more controllers comprising a processing circuit configured to:
receive, from system control modules, respective power flow directions as measured by a first line current sensor and a second line current sensor;
receive, from the system control modules, respective voltage measurements as measured by a first potential transformer and a second potential transformer; and
determine a potential phase of a power fault based on the respective voltage measurements.

17. The control system of claim 16, further comprising a respective line current sensor between a first neutral bus and each of a respective second neutral bus of each of a generator and a utility power source.

18. The control system of claim 17, wherein the one or more controllers is further configured to:
receive, from the system control modules, current values measured by the first line current sensor and a second line current sensor between the first neutral bus and each of the second neutral buses of the generator and the utility power source;
determine a location of the power fault further based on respective directions of power flow at each of the first line current sensor and the second line current sensor between the first neutral bus and each of the second neutral buses of the generator and the utility power source; and
determine a phase of the power fault further based on respective directions of power flow at each of the first line current sensor and the second line current sensor between the first neutral bus and each of the second neutral buses of the generator and the utility power source.

19. The control system of claim 18, wherein the one or more controllers are further configured to:
receive a first value of current flow from the first line current sensor, the first line current sensor electrically coupled between a generator load bus and a load bus of the power system;
receive a second value of current flow from the second line current sensor, the second line current sensor electrically coupled between the generator load bus and the load bus of the power system;
receive a third value of current flow from a third line current sensor electrically coupled between a utility bus and the load bus of the power system;
receive a first value of voltage from the first potential transformer;
receive a second value of voltage from the second potential transformer;
receive a third value of voltage from a third potential transformer;
determine a first direction of power flow in the first line current sensor using the first value of current flow;
determine a second direction of power flow in the second line current sensor using the second value of current flow;
determine a third direction of power flow in the third line current sensor using the third value of current flow;
determine a power fault is located on one of the generator load bus of the power system or the load bus of the power system based on the first direction of power flow the second direction of power flow, and the third direction of power flow; and
determine a phase of the power fault is located on one of the generator load bus of the power system or the load bus of the power system based on the first value of voltage, the second value of voltage, and the third value of voltage.

20. The control system of claim 19, wherein the one or more controllers is further configured to determine no power fault present in the power system based on the respective directions of power flow at each of the first line current sensor, the second line current line sensor, and the third line current sensor.

* * * * *